US008502341B2

(12) United States Patent
Lee et al.

(10) Patent No.: US 8,502,341 B2
(45) Date of Patent: Aug. 6, 2013

(54) TRENCH-TYPE CAPACITOR, SEMICONDUCTOR DEVICE HAVING THE SAME, AND SEMICONDUCTOR MODULE HAVING THE SEMICONDUCTOR DEVICE

(75) Inventors: Chul Lee, Seoul (KR); Hyeong-Sun Hong, Seongnam-si (KR); Deok-Sung Hwang, Yongin-si (KR); Jae-Man Yoon, Hwaseong-si (KR); Bong-Soo Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 75 days.

(21) Appl. No.: 13/021,333

(22) Filed: Feb. 4, 2011

(65) Prior Publication Data
US 2011/0210421 A1 Sep. 1, 2011

(30) Foreign Application Priority Data

Feb. 26, 2010 (KR) ........................ 10-2010-0018086

(51) Int. Cl.
*H01L 29/92* (2006.01)
(52) U.S. Cl.
USPC ........................................................ 257/532
(58) Field of Classification Search
USPC ................. 257/334, 503, 504, 505, 509, 510, 257/654, 774, E21.027, E21.058, E21.166, 257/E21.215, E21.216, E21.231, E21.499, 257/E21.577, E21.585, E21.59
See application file for complete search history.

(56) References Cited

U.S. PATENT DOCUMENTS

| 7,309,911 | B2 * | 12/2007 | Bartley et al. | 257/675 |
| 7,485,911 | B2 | 2/2009 | Kim et al. | |
| 7,799,643 | B2 * | 9/2010 | Kang et al. | 438/272 |
| 2001/0025973 | A1 * | 10/2001 | Yamada et al. | 257/296 |
| 2006/0022242 | A1 * | 2/2006 | Sugatani et al. | 257/296 |
| 2008/0048333 | A1 * | 2/2008 | Seo et al. | 257/773 |
| 2008/0191288 | A1 * | 8/2008 | Kwon et al. | 257/383 |
| 2008/0283957 | A1 * | 11/2008 | Kang et al. | 257/499 |
| 2009/0111232 | A1 * | 4/2009 | Kim et al. | 438/296 |
| 2009/0114991 | A1 * | 5/2009 | Kim et al. | 257/365 |
| 2011/0175229 | A1 * | 7/2011 | Kim et al. | 257/773 |
| 2012/0175692 | A1 * | 7/2012 | Kang | 257/296 |
| 2012/0211830 | A1 * | 8/2012 | Yoo | 257/334 |

FOREIGN PATENT DOCUMENTS

| JP | 2007-324489 | 12/2007 |
| KR | 100675281 | 1/2007 |
| KR | 1020080087304 | 1/2008 |

* cited by examiner

*Primary Examiner* — Dao H Nguyen
*Assistant Examiner* — Tram H Nguyen
(74) *Attorney, Agent, or Firm* — F. Chau & Associates, LLC

(57) ABSTRACT

Provided is a trench-type capacitor. To form the capacitor, first and second active regions are disposed in a semiconductor substrate. Node patterns are disposed in the first active region. Each node pattern may have a conductive pattern and an insulating pattern, which are sequentially stacked. Impurity diffusion regions are disposed in the vicinity of the node patterns. Substrate connection patterns in electrical contact with the first and second active regions are disposed. Node connection patterns in electrical contact with the node patterns are disposed in the vicinity of the first and second active regions. In addition, a semiconductor device having the trench-type capacitor and a semiconductor module having the semiconductor device is provided.

20 Claims, 16 Drawing Sheets

TRENCH-TYPE CAPACITOR, SEMICONDUCTOR DEVICE HAVING THE SAME, AND SEMICONDUCTOR MODULE HAVING THE SEMICONDUCTOR DEVICE

CROSS-REFERENCE TO RELATED APPLICATION

This application claims priority under 35 U.S.C. §119 to Korean Patent Application No. 10-2010-0018086 filed on Feb. 26, 2010, the disclosure of which is incorporated herein by reference in its entirety.

BACKGROUND

1. Field

Embodiments of the inventive concept relate to a trench-type capacitor, a semiconductor device having the trench-type capacitor, and a semiconductor module having the semiconductor device.

2. Discussion of Related Art

Generally, a semiconductor device may be driven by internal power sources generated in an integrated circuit based on external power sources. The voltage levels of the external power sources may be lower than those of the internal power sources. The voltage levels of the external power sources may not provide sufficient current to the integrated circuit. Accordingly, the voltage levels of the external power sources may be increased so that the internal power sources may provide sufficient current to the integrated circuit to drive the semiconductor device.

A large quantity of current provided to the integrated circuit may cause an undesirable electrical phenomenon, such as a noise spike that may occur around the internal power sources of the integrated circuit, and degrade the function of the integrated circuit. The noise spike may be controlled by a decoupling capacitor provided around the internal power sources.

The decoupling capacitor may be a planar-type capacitor that does not have a concave portion in a semiconductor substrate. As the size of the semiconductor device decreases, the size of the decoupling capacitor is also reduced. Such a decoupling capacitor may have insufficient capacitance, thus failing to provide a good control of the noise spike and degrading the electrical characteristics of the semiconductor device.

SUMMARY

Embodiments of the inventive concept provide a trench-type capacitor in a concave portion of a semiconductor substrate to increase capacitance, a semiconductor device that includes a stack-type capacitor located on the semiconductor substrate in the cell array region, and a trench-type capacitor located in a concave portion of the semiconductor substrate in the peripheral circuit region, and a semiconductor module having the semiconductor device.

A trench-type capacitor according to an embodiment may include an inactive region. The inactive region may be located in a semiconductor substrate and may define first and second active regions. At least one node pattern may have a conductive pattern and a mask pattern which are sequentially stacked from a lower portion of the semiconductor substrate to a top surface of the semiconductor substrate. The at least one node pattern may extend from the first active region to the inactive region.

A substrate connection pattern may be located on the semiconductor substrate and may be in electrical contact with the first and second active regions. A node connection pattern may be spaced apart from the substrate connection pattern on the inactive region and may be in electrical contact with the at least one node pattern.

According to an embodiment, the trench-type capacitor may further include at least one first impurity diffusion region. The at least one first impurity diffusion region may be located in the vicinity of the at least one node pattern. The at least one first impurity diffusion region may extend downwardly from a top surface of the first active region lower than a bottom surface of the mask pattern. A second impurity diffusion region may be disposed in the second active region.

The at least one first impurity diffusion region may have a different conductivity type from the second impurity diffusion region. The second impurity diffusion region may have the same conductivity type as the semiconductor substrate. The substrate connection pattern may extend from the first active region to the second active region and may be in electrical contact with the at least one first impurity diffusion region and the second impurity diffusion region through plugs.

According to an embodiment, the trench-type capacitor may further include a dielectric layer. The dielectric layer may be between the at least one node pattern and the semiconductor substrate. The node connection pattern may be in electrical contact with the at least one node pattern through a stud. The stud may extend toward the top surface from an upper portion of the semiconductor substrate and may be in contact with the conductive pattern through the mask pattern of the at least one node pattern. A bottom surface of the stud may have the same width as or a different width from the conductive pattern.

According to an embodiment, the trench-type capacitor may further include at least one dummy pattern. The at least one dummy pattern may be spaced apart from the first active region and disposed in the inactive region. The at least one dummy pattern may be located at the same level as the at least one node pattern and may have the same stacked structure as the at least one node pattern. The at least one dummy pattern may be disposed in the vicinity of the at least one node pattern to be parallel to the at least one node pattern. The substrate connection pattern may be disposed at the same level as the node connection pattern.

According to an embodiment, the trench-type capacitor may further include at least one dummy pattern. The at least one dummy pattern may be spaced apart from the first active region and disposed in the inactive region. The at least one dummy pattern may be located at the same level as the at least one node pattern and may have the same stacked structure as the at least one node pattern. The at least one dummy pattern may be disposed in the vicinity of the at least one node pattern to be parallel to the at least one node pattern. The substrate connection pattern may be disposed at a different level from the node connection pattern.

A semiconductor device according to an embodiment may include a semiconductor substrate having a cell array region and a peripheral circuit region. An inactive region may define at least one cell active region in the cell array region, and first and second peripheral active regions in the peripheral circuit region. At least one cell buried pattern may be located in the cell array region and may have a cell conductive pattern and a cell mask pattern which are sequentially stacked from a lower portion of the semiconductor substrate to a top surface of the semiconductor substrate. The at least one cell buried pattern may extend from the at least one cell active region to the inactive region.

At least one trench-type capacitor may be located in the peripheral circuit region. The trench-type capacitor may include node patterns. The node patterns may be located at the same level as the at least one cell buried pattern and may have peripheral conductive patterns and peripheral mask patterns which are sequentially stacked from the lower portion to the top surface of the semiconductor substrate. The node patterns may extend from the first peripheral active region to the inactive region. A substrate connection pattern may be located on the semiconductor substrate and may be in electrical contact with the first and second peripheral active regions. A node connection pattern may be spaced apart from the substrate connection pattern and may be located on the inactive region. A node connection pattern may be in electrical contact with the node patterns.

According to an embodiment, the semiconductor device may further include first impurity diffusion regions. The first impurity diffusion regions may be located in the vicinity of the at least one cell buried pattern and the node patterns. The first impurity diffusion regions may extend downwardly from top surfaces of the at least one cell active region and the first peripheral active region lower than bottom surfaces of the cell mask pattern and the peripheral mask patterns. A second impurity diffusion region may be disposed in the second peripheral active region.

According to an embodiment, the first impurity diffusion regions may have a different conductivity type from the second impurity diffusion region. The second impurity diffusion region may have the same conductivity type as the semiconductor substrate. The substrate connection pattern may extend from the first peripheral active region to the second peripheral active region. The substrate connection pattern may be in electrical contact with the first and second impurity diffusion regions of the first and second peripheral active regions through first plugs.

According to an embodiment, the semiconductor device may further include at least one stack-type capacitor. The at least one stack-type capacitor may be located at an upper portion of the semiconductor substrate and may be in electrical contact with the at least one cell active region in the vicinity of the at least one cell buried pattern. First dielectric layers may be disposed between the node patterns and the first peripheral active regions.

According to a selected embodiment, the at least one stack-type capacitor may be in electrical contact with a first impurity region of the at least one cell active region through a second plug. The at least one stack-type capacitor may have a lower node, a second dielectric layer and an upper node which are sequentially stacked. The substrate connection pattern may be located at the same level as or a different level from the node connection pattern.

According to an embodiment, the semiconductor device may further include dummy patterns. The dummy patterns may be spaced apart from the first peripheral active region and may be disposed in the inactive region. The dummy patterns may be located at the same level as the node patterns and may have the same stacked structure as the node patterns. The dummy patterns may be located near both sides of the node patterns along an arrangement direction of the node patterns. The node patterns may have end portions in the vicinity of both sides of the first peripheral active region in a direction perpendicular to the arrangement direction.

According to an embodiment, the node connection pattern may be in electrical contact with the end portions of the node patterns through studs in the vicinity of at least one side of the first peripheral active region. The studs may extend to the top surface from the upper portion of the semiconductor substrate and may be in contact with the peripheral conductive patterns through peripheral mask patterns of the node patterns. A bottom surface of each stud may have the same width as or a different width from each peripheral conductive pattern.

According to an embodiment, the node connection pattern may be in electrical contact with selected end portions every at least second node pattern through studs in the vicinity of the both sides of the first peripheral active region. The studs may extend to the top surface from the upper portion of the semiconductor substrate and may be in contact with the peripheral conductive patterns through the peripheral mask patterns of the selected end portions. A bottom surface of each stud may have the same width as or a different width from each peripheral conductive pattern.

According to an embodiment, the semiconductor device may further include connection lines located between the node patterns in the inactive region. The connection lines may be located at the same level as the node patterns and may have the same stacked structure as the node patterns. The connection lines may connect end portions of the node patterns in the vicinity of one side of the first peripheral active region or end portions of the node patterns defining odd- or even-numbered spaces between the node patterns along the alignment direction of the node patterns. The node connection pattern may be in electrical contact with the at least one of the connection lines and the node patterns through at least one stud.

The at least one stud may extend to the top surface from the upper portion of the semiconductor substrate, and may be in contact with a peripheral conductive pattern through at least one peripheral mask pattern of the node patterns and the connection lines. A bottom surface of the at least one stud may have the same width as or a different width from the peripheral conductive pattern.

According to an embodiment, the semiconductor device may further first and second connection lines located between the node patterns. The first and second connection lines may be located at the same level as the node patterns and may have the same stacked structure as the node patterns. The first connection lines may connect selected end portions of the node patterns defining odd- or even-numbered spaces between the node patterns in the vicinity of one side of the first peripheral active region along the arrangement direction of the node patterns. The second connection lines may connect the remaining end portions of the node patterns defining even- or odd-numbered spaces between the node patterns in the vicinity of the other side of the first peripheral active region along the arrangement direction of the node patterns.

The node connection pattern may be in electrical contact with at least one of the node patterns, and the first and second connection lines through at least one stud. The at least one stud may extend to the top surface from the upper portion of the semiconductor substrate and may be in contact with a peripheral conductive pattern through at least one peripheral mask pattern of the node patterns, and the first and second connection lines. A bottom surface of the at least one stud may have the same width as or a different width from the peripheral conductive pattern.

A semiconductor module according to an embodiment may include a module substrate. The module substrate may have at least electrical pads and an internal circuit, which are in electrical contact with each other. At least one semiconductor package structure may be located on the module substrate and may have at least one semiconductor device in electrical contact with the electrical pads. The at least one semiconductor device may have at least one trench-type capacitor in a semiconductor substrate. The trench-type capacitor may include an inactive region. The inactive region may be located in the semiconductor substrate and may define first and second active regions.

At least one node pattern may have a conductive pattern and a mask pattern which are sequentially stacked from a lower portion of the semiconductor substrate to a top surface of the semiconductor substrate, and may extend from the first active region to the inactive region. A substrate connection pattern may be located on the semiconductor substrate and may be in electrical contact with the first and second active regions. A node connection pattern may be spaced apart from the substrate connection pattern and may be located on the inactive region. The node connection pattern may be in electrical contact with the at least one node pattern.

According to an embodiment, the semiconductor module may further include at least one first impurity diffusion region. The at least one first impurity diffusion region may be located in the vicinity of the at least one node pattern and may extend downwardly from a top surface of the first active region lower than a bottom surface of the mask pattern. A second impurity diffusion region may be disposed in the second active region. The at least one first impurity diffusion region may have a different conductivity type from the second impurity diffusion region. The second impurity diffusion region may have the same conductivity type as the semiconductor substrate. The substrate connection pattern may extend from the first active region to the second active region and may be in electrical contact with the at least one first impurity diffusion region and the second impurity diffusion region through plugs.

According to an embodiment, the semiconductor module may further include a dielectric layer. The dielectric layer may be between the at least one node pattern and the semiconductor substrate. The node connection pattern may be in electrical contact with the at least one node pattern through a stud. The stud may extend to the top surface from an upper portion of the semiconductor substrate and may be in contact with the conductive pattern through the mask pattern of the at least one node pattern. A bottom surface of the stud may have the same width as or a different width from the conductive pattern.

According to an embodiment, the semiconductor module may further include at least one dummy pattern. The at least one dummy pattern may be spaced apart from the first active region and disposed in the inactive region. The at least one dummy pattern may be located at the same level as the at least one node pattern and may have the same stacked structure as the at least one node pattern. The at least one dummy pattern may be disposed in the vicinity of the at least one node pattern to be parallel to the at least one node pattern. The substrate connection pattern may be disposed at the same level as the node connection pattern.

According to an embodiment, the semiconductor module may further include at least one dummy pattern. The at least one dummy pattern may be spaced apart from the first active region and disposed in the inactive region. The at least one dummy pattern may be located at the same level as the at least one node pattern and may have the same stacked structure as the at least one node pattern. The at least one dummy pattern may be disposed in the vicinity of the at least one node pattern to be parallel to the at least one node pattern. The substrate connection pattern may be disposed at a different level from the node connection pattern.

BRIEF DESCRIPTION OF THE DRAWINGS

The embodiments of the inventive concepts will be apparent from the more particular description of embodiments of the inventive concepts, as illustrated in the accompanying drawings in which the same reference characters refer to the same or substantially the same parts throughout the drawings and the specification. The drawings are not necessarily to scale, emphasis instead being placed upon illustrating the principles of the inventive concepts. In the drawings.

DETAILED DESCRIPTION OF THE EMBODIMENTS

Various embodiments will now be described more fully with reference to the accompanying drawings in which some embodiments are shown. It will be understood that when an element or layer is referred to as being "on," "connected to" or "coupled to" another element or layer, it can be directly on, connected or coupled to the other element or layer or intervening elements or layers may be present. Like numerals may refer to like elements throughout the specification and the drawings.

Hereinafter, a trench-type capacitor and a semiconductor device having the trench-type capacitor according to embodiments of the inventive concept will be described with reference to FIGS. 1 and 2 in detail.

Figure 1:
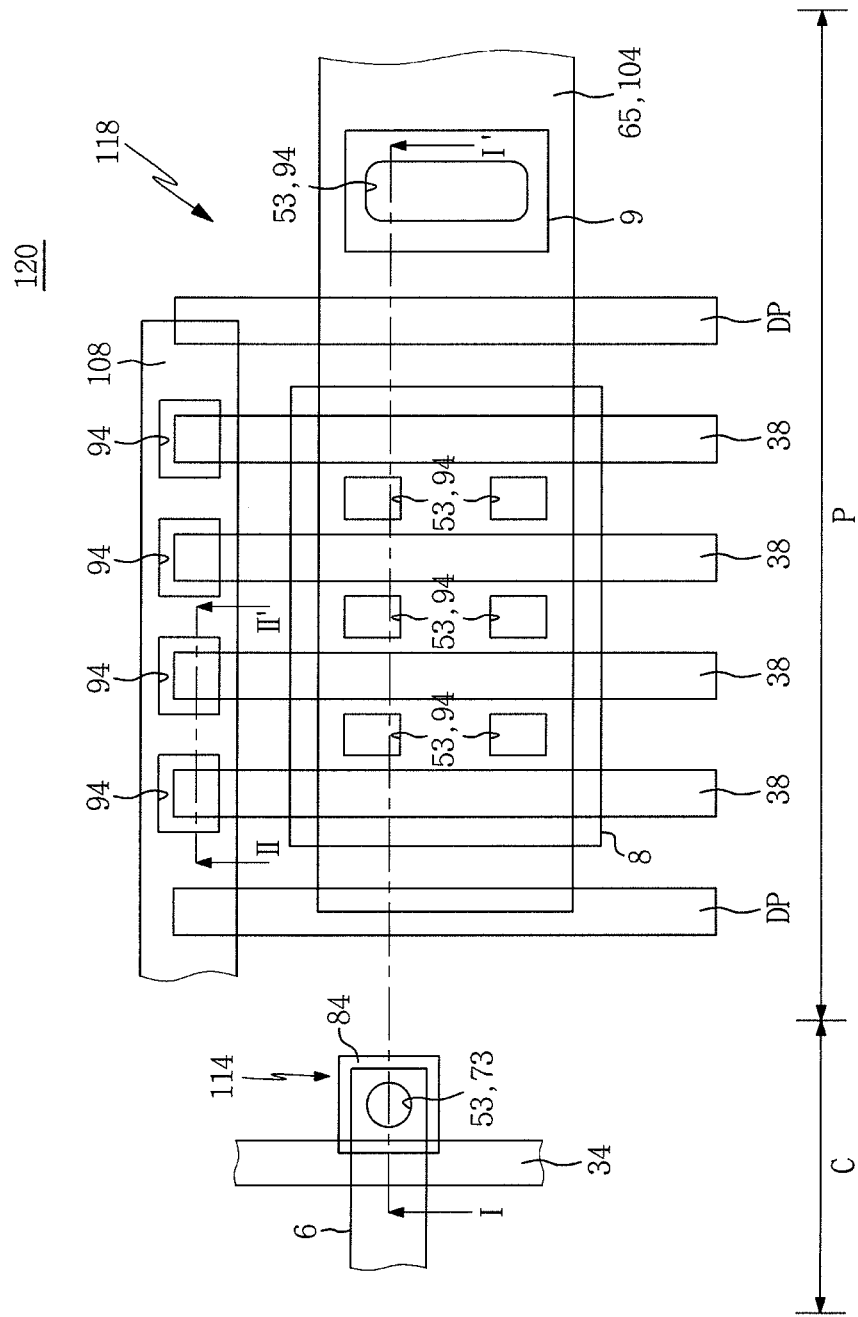
FIG. 1 is a plan view of a semiconductor device according to an embodiment of the inventive concept.

Referring to FIG. 1, a semiconductor device 120 according to an embodiment includes at least one stack-type capacitor 114 in a cell array region C, and a trench-type capacitor 118 in a peripheral circuit region P. The stack-type capacitor 114 includes a lower node 84. The stack-type capacitor 114 is in electrical contact with a cell active region 6 through at least one of a connection hole 53 and a landing hole 73. At least one cell active region 6 is disposed in the cell array region C.

The cell active region 6 extends from at least one of the connection hole 53 or the landing hole 73, and is exposed from the lower node 84. At least one cell buried pattern 34 crossing the cell active region 6 is disposed in the cell array region C. The trench-type capacitor 118 includes dummy patterns DP and node patterns 38. The dummy patterns DP are disposed at or near both sides of the node patterns 38 along an arrangement direction of the node patterns 38. At least one dummy pattern DP is disposed at each side of the node patterns 38.

A first peripheral active region 8 is interposed between the dummy patterns DP. The first peripheral active region 8 overlaps the node patterns 38. The dummy patterns DP and the node patterns 38 have end portions at or near both sides of the first peripheral active region 8 in a direction perpendicular to the arrangement direction of the dummy patterns DP and the node patterns 38. A second peripheral active region 9 is disposed in the vicinity of the first peripheral active region 8. The second peripheral active region 9 is spaced apart from the dummy patterns DP and the node patterns 38. A substrate connection pattern 65 or 104 is disposed along the arrangement direction of the dummy patterns DP and the node patterns 38.

The substrate connection pattern 65 is in electrical contact with the first and second peripheral active regions 8 and 9 through connection holes 53. The substrate connection pattern 104 is in electrical contact with the first and second peripheral active regions 8 and 9 through selected through holes 94. A node connection pattern 108 is disposed along the arrangement direction of the dummy patterns DP and the node patterns 38. The node connection pattern 108 is in electrical contact with the end portions of the node patterns 38 through the remaining through holes 94 in the vicinity of a predetermined side of the first peripheral active region 8.

Alternatively, the node connection pattern 108 may be in electrical contact with the end portions of the node patterns 38 by appropriately arranging the remaining through holes 94 in the vicinity of both sides of the first peripheral active region 8. According to an embodiment, the node connection pattern 108 is located at or near both sides of the first peripheral active region 8, and is disposed parallel to the arrangement direction of the dummy patterns DP and the node pattern 38.

Figure 2:
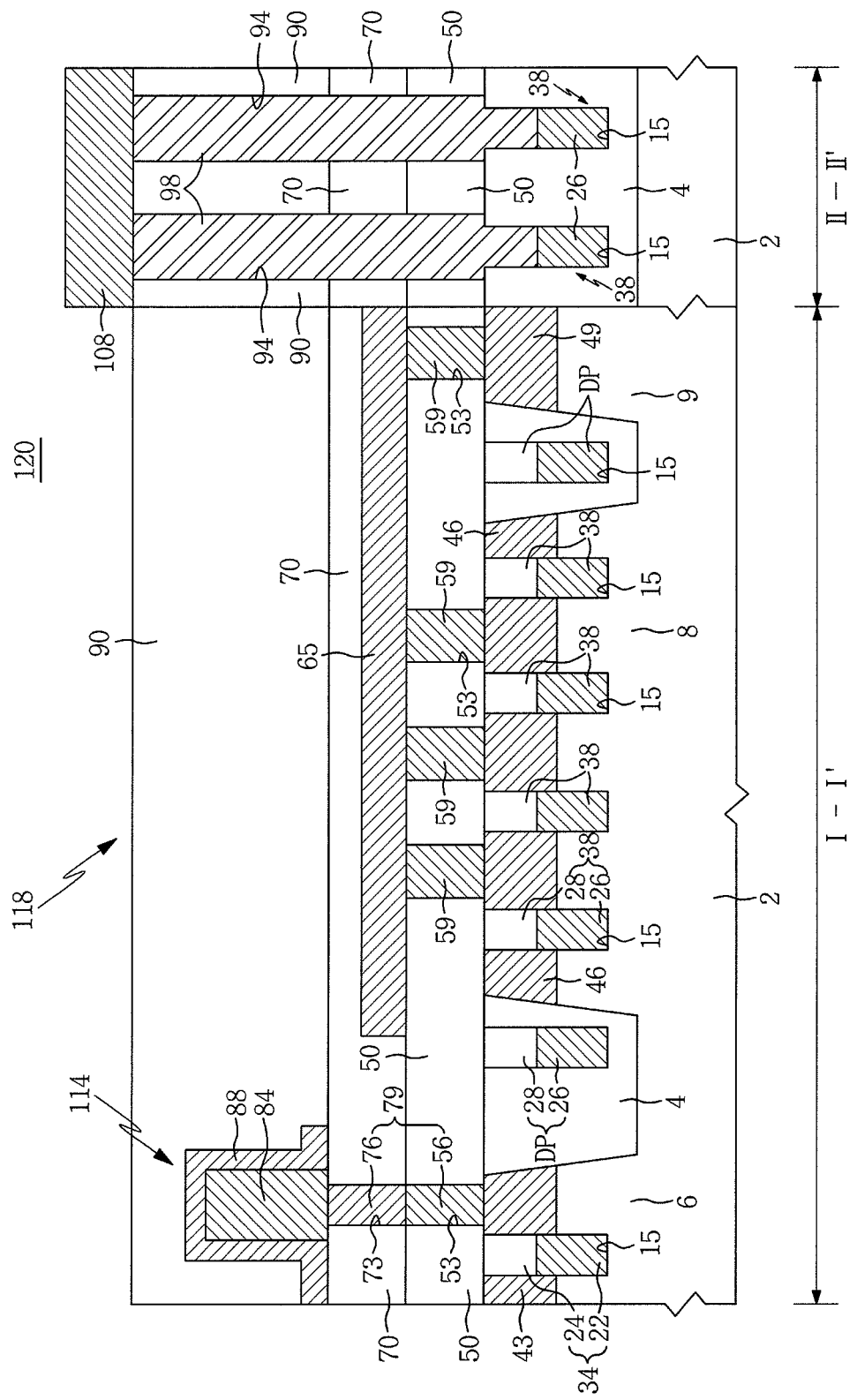
FIG. 2 is a cross-sectional view taken along lines I-I' and II-II' of FIG. 1, which shows a semiconductor device according to an embodiment of the inventive concept.

Referring to FIG. 2, a semiconductor device 120 according to an embodiment includes at least one cell buried pattern 34 in a semiconductor substrate 2 in a cell array region C. The cell buried pattern 34 has a cell conductive pattern 22 and a cell mask pattern 24, which are sequentially stacked from a lower portion of the semiconductor substrate 2 to a top surface of the semiconductor substrate 2. The cell buried pattern 34 fills a trench 15 located in the semiconductor substrate 2 in the cell array region C. The trench 15 in the cell array region C is disposed in an inactive region 4 and a cell active region 6.

At least one cell active region 6 is disposed in the cell array region C to be surrounded by the inactive region 4. The cell buried pattern 34 is surrounded by the cell active region 6. Cell impurity diffusion regions 43 are disposed in the cell active region 6. The cell impurity diffusion regions 43 are disposed adjacent to the cell buried pattern 34. The cell impurity diffusion regions 43 extends downwardly from top surfaces of the inactive region 4 and the cell active region 6 lower than a bottom surface of the cell mask pattern 24 of the cell buried pattern 34.

A first cell plug 56 is disposed in the vicinity of the cell buried pattern 34. The first cell plug 56 is in contact with at least one of the cell impurity diffusion regions 43. The first cell plug 56 extends upwardly from a top surface of the semiconductor substrate 2. A second cell plug 76 is disposed on the first cell plug 56. The second cell plug 76 is in contact with the first cell plug 56. The first and second plugs 56 and 76 constitute a cell plug 79.

A stack-type capacitor 114 is disposed on the second cell plug 76. The stack-type capacitor 114 has a lower node 84 and an upper node 88. A cell dielectric layer (not shown) is interposed between the lower node 84 and the upper node 88. The semiconductor device 120 further includes dummy patterns DP and node patterns 38 in the semiconductor substrate 2 in a peripheral circuit region P. The dummy patterns DP and the node patterns 38 are located at the same level as the cell buried pattern 34 in the semiconductor substrate 2.

Each of the dummy patterns DP and the node patterns 38 has a peripheral conductive pattern 26 and a peripheral mask pattern 28, which are stacked upwardly from the lower portion of the semiconductor substrate 2 to the top surface thereof. Trenches 15 located in the semiconductor substrate 2 in the peripheral circuit region P are filled with the dummy patterns DP and the node patterns 38. The dummy patterns DP are disposed in the trenches 15 and surrounded by the inactive region 4. The node patterns 38 are disposed in the trenches 15 and surrounded by the inactive region 4 and the first peripheral active region 8.

The node patterns 38 are interposed between the dummy patterns DP. A peripheral dielectric layer (not shown) is interposed between the semiconductor substrate 2, the dummy patterns DP, and the node patterns 38. First peripheral impurity diffusion regions 46 are disposed in the first peripheral active region 8. Second peripheral impurity diffusion regions 49 are disposed in the vicinity of the first peripheral impurity diffusion regions 46. The second peripheral impurity diffusion regions 49 are disposed in a second peripheral active region 9.

The first and second peripheral active regions 8 and 9 are surrounded by the cell active region 6 and the inactive region 4. The first peripheral impurity diffusion regions 46 extend downwardly from a top surface of the first peripheral active region 8 lower than a bottom surface of the peripheral mask pattern 28 of each of the node patterns 38. The second peripheral impurity diffusion regions 49 extend downwardly from a top surface of the second peripheral active region 9 lower than a bottom surface of the peripheral mask pattern 28 of each of the dummy patterns DP.

Peripheral plugs 59 are disposed on the first and second peripheral active regions 8 and 9. The peripheral plugs 59 extend upwardly from the top surface of the semiconductor substrate 2. Some of the peripheral plugs 59 are located between the node patterns 38 and electrically contact the first peripheral active region 8. The remaining peripheral plug 59 is in electrical contact with the second peripheral active region 9. Substrate connection patterns 65 are disposed on the peripheral plugs 59. The substrate connection patterns 65 are in electrical contact with the peripheral plugs 59.

A node connection pattern 108 is disposed in the vicinity of the substrate connection pattern 65 on a third interlayer insulating layer 90. The node connection pattern 108 is located at a higher level than the substrate connection pattern 65. The node connection pattern 108 is in electrical contact with end portions of the node patterns 38 through studs 98. The studs 98 have different widths on and under a top surface of the inactive region 4. A bottom surface of each stud 98 has the same width as the peripheral conductive pattern 26 of the node patterns 38.

A trench-type capacitor 118 includes the node connection pattern 108, the semiconductor substrate 2, the node patterns 38, the first and second peripheral impurity diffusion regions 46 and 49, the peripheral plugs 59, the substrate connection pattern 65, and the studs 98. The trench-type capacitor 118 has a larger area than that in the conventional art because it is disposed in the trenches 15 of the semiconductor substrate 2. A first interlayer insulating layer 50 is disposed on the semiconductor substrate 2. The first interlayer insulating layer 50 has connection holes 53 in the cell array region C and the peripheral circuit region P.

The connection holes 53 are filled with the first cell plug 56 in the cell array region C and the peripheral plugs 59 in the peripheral circuit region P. A second interlayer insulating layer 70 is disposed on the first interlayer insulating layer 50. The second interlayer insulating layer 70 covers the substrate connection pattern 65 and have a landing hole 73. The landing hole 73 is filled with the second cell plug 76. A third interlayer insulating layer 90 is interposed between the second interlayer insulating layer 70 and the node connection pattern 108. The third interlayer insulating layer 90 covers the stack-type capacitor 114.

Through holes 94 are disposed in the first to third interlayer insulating layers 50, 70, and 90. The through holes 94 are aligned with the end portions of the node patterns 38. The through holes 94 are filled with the studs 98.

Figure 3:
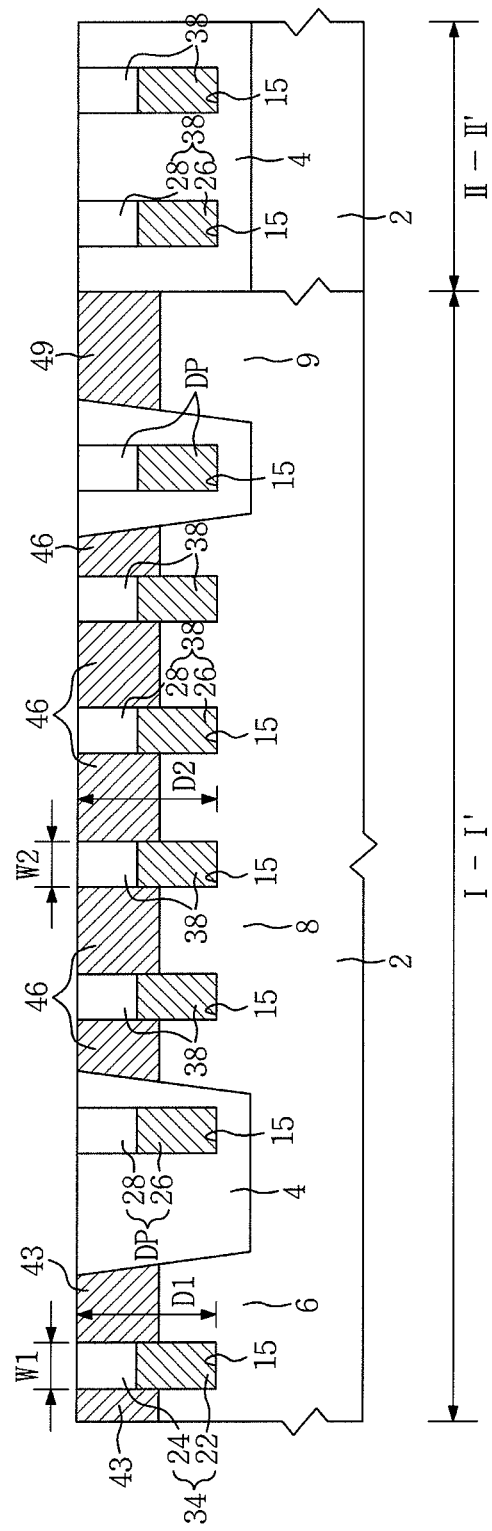
FIGS. 3 through 7 are cross-sectional views taken along lines I-I' and II-II' of FIG. 1, which illustrate a method of forming a semiconductor device according to an embodiment of the inventive concept.
Figure 4:
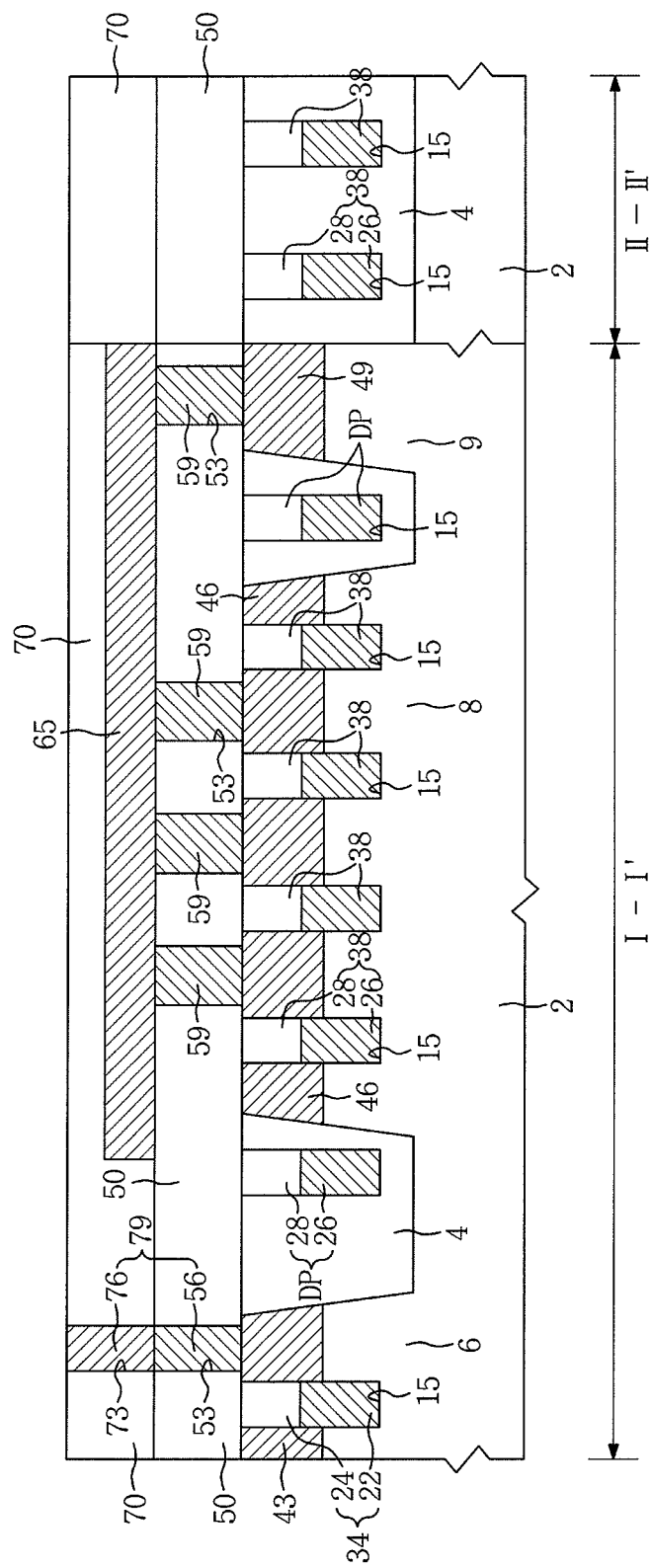
Figure 5:
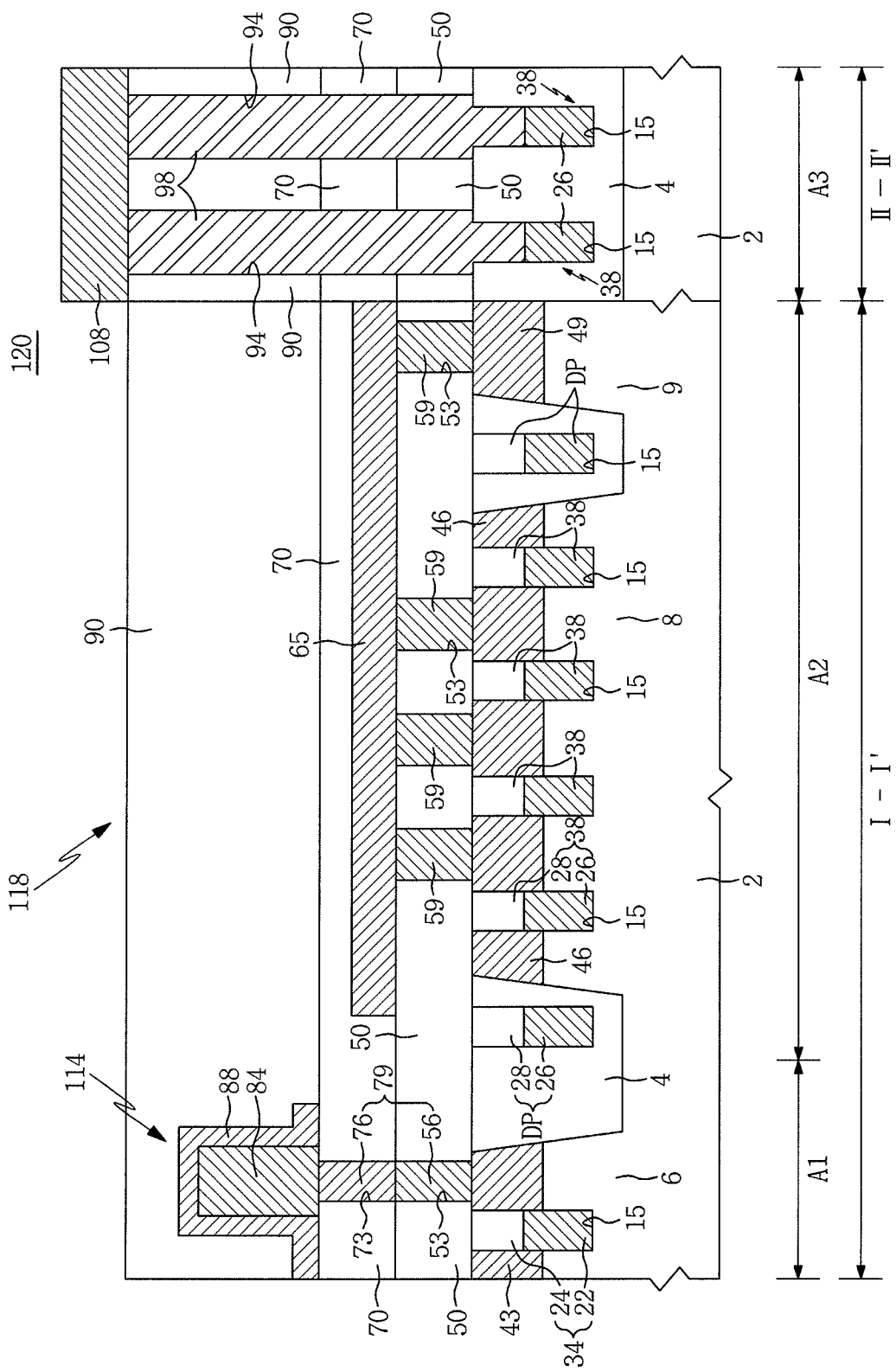

FIGS. 3 through 5 are cross-sectional views taken along lines I-I' and II-II' of FIG. 1, which illustrate a method of forming a semiconductor device according to an embodiment of the inventive concept.

Referring to FIG. 3, according to an embodiment, a semiconductor substrate 2 is prepared. The semiconductor substrate 2 has a cell array region C and a peripheral circuit region P as shown in FIG. 1. The semiconductor substrate 2 has an n- or p-type conductivity. An inactive region 4 is formed in the semiconductor substrate 2. The inactive region 4 defines at least one cell active region 6 in the semiconductor substrate 2 of the cell array region C. The inactive region 4 defines first and second peripheral active regions 8 and 9 in the semiconductor substrate 2 of the peripheral circuit region P.

Trenches 15 are formed in the semiconductor substrate 2. The trenches 15 extend downwardly from a top surface of the semiconductor substrate 2 to a lower portion thereof. The trenches 15 are formed in the inactive region 4, the active region 6, and the first and second peripheral active regions 8 and 9. The trench 15 of the cell array region C has a first depth D1 and a first width W1. Each of trenches 15 of the peripheral circuit region P has a second depth D2 and a second width W2.

In the trench 15 of the cell array region C, a cell conductive pattern 22 and a cell mask pattern 24 are sequentially formed. The cell conductive pattern 22 is formed of a conductive material. The mask pattern 24 is formed of an insulating material. The cell conductive pattern 22 and the cell mask pattern 24 constitute at least one cell buried pattern 34. The cell buried pattern 34 may be a gate pattern or a bit line pattern. In each of the trenches 15 of the peripheral circuit region P, a peripheral conductive pattern 26 and a peripheral mask pattern 28 are sequentially formed.

The peripheral conductive pattern 26 and the peripheral mask pattern 28 may be formed in the same steps as or different steps from the steps of forming the cell conductive pattern 22 and the cell mask pattern 24. The peripheral conductive pattern 26 and the peripheral mask pattern 28 constitute each of dummy patterns DP and node patterns 38. The dummy patterns DP are formed in the trenches 15 of the inactive region 4. The node patterns 38 are formed in the inactive region 4 and the first peripheral active region 8.

Peripheral dielectric layers (not shown) are formed between the inactive region 4, the first peripheral active region 8, the dummy pattern DP, and the node patterns 38. The peripheral dielectric layer is formed of an insulating material. Cell impurity diffusion regions 43 are formed in the cell active region 6. The cell impurity diffusion regions 43 may have the same conductivity type as or a different conductivity type from that of the semiconductor substrate 2. The cell impurity diffusion regions 43 extend downwardly from a top surface of the cell active region 6 lower than a bottom surface of the cell mask pattern 24 of the cell buried pattern 34.

First and second peripheral impurity diffusion regions 46 and 49 are formed in the first and second peripheral active regions 8 and 9. The first peripheral impurity diffusion regions 46 may be formed at the same level as or a different level from the second peripheral impurity diffusion region 49. The first peripheral impurity diffusion regions 46 may be formed in a different step from a step of forming the second peripheral impurity diffusion region 49. The first peripheral impurity diffusion regions 46 may have the same conductivity type as or a different conductivity type from that of the cell impurity diffusion region 43.

The first peripheral impurity diffusion regions 46 may be formed in the same step as or a different step from a step of forming the cell impurity diffusion region 43. The second peripheral impurity diffusion region 49 may have a different conductivity type from the first peripheral impurity diffusion regions 46.

Referring to FIG. 4, according to an embodiment, a first interlayer insulating layer 50 is formed on the inactive region 4, the cell active region 6, and the first and second peripheral active regions 8 and 9. The first interlayer insulating layer 50 covers the cell buried pattern 34, the dummy patterns DP, the node patterns 38, the cell impurity diffusion regions 43, and the first and second peripheral impurity diffusion regions 46 and 49. The first interlayer insulating layer 50 is formed of an insulating material. Connection holes 53 are formed in the first interlayer insulating layer 50.

A connection hole 53 exposes a cell impurity diffusion region 43. The remaining connection holes 53 expose the first and second peripheral impurity diffusion regions 46 and 49. A first cell plug 56 and peripheral plugs 59 are formed in the connection holes 53. The first cell plug 56 and the peripheral plugs 59 sufficiently fill the connection holes 53. The first cell plug 56 may be formed of a conductive material the same as or different from that for the peripheral plugs 59. The first cell plug 56 may be formed in the same step as or a different step from a step of forming the peripheral plugs 59.

A substrate connection pattern 65 is formed on the first interlayer insulating layer 50 to cover the peripheral plugs 59. The substrate connection pattern 65 exposes the first cell plug 56. The substrate connection pattern 65 may be formed of a conductive material the same as or different from those for the peripheral plugs 59. A second interlayer insulating layer 70 is formed on the first interlayer insulating layer 50 to cover the first cell plug 56 and the substrate connection pattern 65.

The second interlayer insulating layer 70 may be formed of an insulating material the same as or different from that for the first interlayer insulating layer 50. A landing hole 73 is formed in the second interlayer insulating layer 70. The landing hole 73 is aligned with the first cell plug 56 to expose the first cell plug 56. A second cell plug 76 is formed in the landing hole 73. The second cell plug 76 may be formed of a conductive material the same as or different from that for the first cell plug 56. The first and second cell plugs 56 and 76 constitute a cell plug 79.

Referring to FIG. 5, according to an embodiment, a stack-type capacitor 114 is formed on the second interlayer insulating layer 70. The stack-type capacitor 114 has a lower node 84, a cell dielectric layer (not shown), and an upper node 88. The lower node 84 may be formed of a conductive material the same as or different from that for the upper node 88. The cell dielectric layer is formed of an insulating material. The stack-type capacitor 114 is in electrical contact with the second cell plug 76 through the lower node 84.

A third interlayer insulating layer 90 is formed on the second interlayer insulating layer 70 to cover the stack-type capacitor 114. The third interlayer insulating layer 90 may be formed of an insulating material the same as or different from that for the second interlayer insulating layer 70. Through holes 94 are formed in the first to third interlayer insulating layers 50, 70, and 90, and the peripheral mask patterns 28 of the node patterns 38. Specifically, the through holes 94 are located in the first to third interlayer insulating layers 50, 70, and 90, and pass through the peripheral mask patterns 28 of the node patterns 38 in the vicinity of at least one side of the first peripheral active region 8 of FIG. 1.

The through holes 94 expose the peripheral conductive patterns 26 of the node patterns 38 in the vicinity of the side of the first peripheral active region 8. The through holes 94 have different widths on and under a top surface of the inactive region 4. Studs 98 are formed in the through holes 94. The studs 98 sufficiently fill the through holes 94. The studs 98 may be formed of a conductive material the same as or different from that for the peripheral conductive patterns 26. A node connection pattern 108 is formed on the third interlayer insulating layer 90 to cover the studs 98.

The node connection pattern 108 may be formed of a conductive material the same as or different from those for the studs 98. A trench-type capacitor 118 includes the node connection pattern 108, the semiconductor substrate 2, the first and second active regions 8 and 9, the node patterns 38, the first and second peripheral impurity diffusion regions 46 and 49, and the substrate connection pattern 65. A semiconductor device 120 includes the trench-type capacitor 118 and the stack-type capacitor 114 according to an embodiment of the inventive concept. Accordingly, the semiconductor device 120 according to embodiments of the inventive concept has structures selected from the regions A1, A2 and A3 of the cell array region C and the peripheral circuit region P as shown in FIG. 5.

According to an embodiment, the upper node 88 of the stack-type capacitor 114 is formed at substantially the same level as the substrate connection pattern 65 of the trench-type capacitor 118. To this end, before forming the second interlayer insulating layer 70, a lower electrode 84 is formed on the first interlayer insulating layer 50. Next, the substrate connection pattern 65 and the upper node 88 are formed on the first interlayer insulating layer 50. Subsequently, the second interlayer insulating layer 70 is formed on the first interlayer insulating layer 50 to cover the substrate connection pattern 65 and the upper node 88.

The studs 98 are formed in the first and second interlayer insulating layers 50 and 70. The node connection pattern 108 is formed on the second interlayer insulating layer 70. According to an embodiment, the third insulating layer 90 may not be formed in the semiconductor device 120. According to an embodiment, the substrate connection pattern 65 of the trench-type capacitor 118 is formed at substantially the same level as the upper node 88 of the stack-type capacitor 114. To this end, the substrate connection pattern 65 is formed on the second interlayer insulating layer 70.

The first and second interlayer insulating layers 50 and 70 have the peripheral plugs 59 under the substrate connection pattern 65. The peripheral plugs 59 are in electrical contact with the first and second peripheral active regions 8 and 9 and the substrate connection pattern 65. According to an embodiment, the substrate connection pattern 65 is formed at the same level as the node connection pattern 108. According to an embodiment, the node connection pattern 108 may be formed of a material the same as or different from that for the substrate connection pattern 65. The studs 98 may be formed of a material the same as or different from those for the peripheral plugs 59.

Further, the substrate connection pattern 65, the upper node 88, and the node connection pattern 108 are formed on the first to third interlayer insulating layers 50, 70, and 90, respectively.

Figure 6:
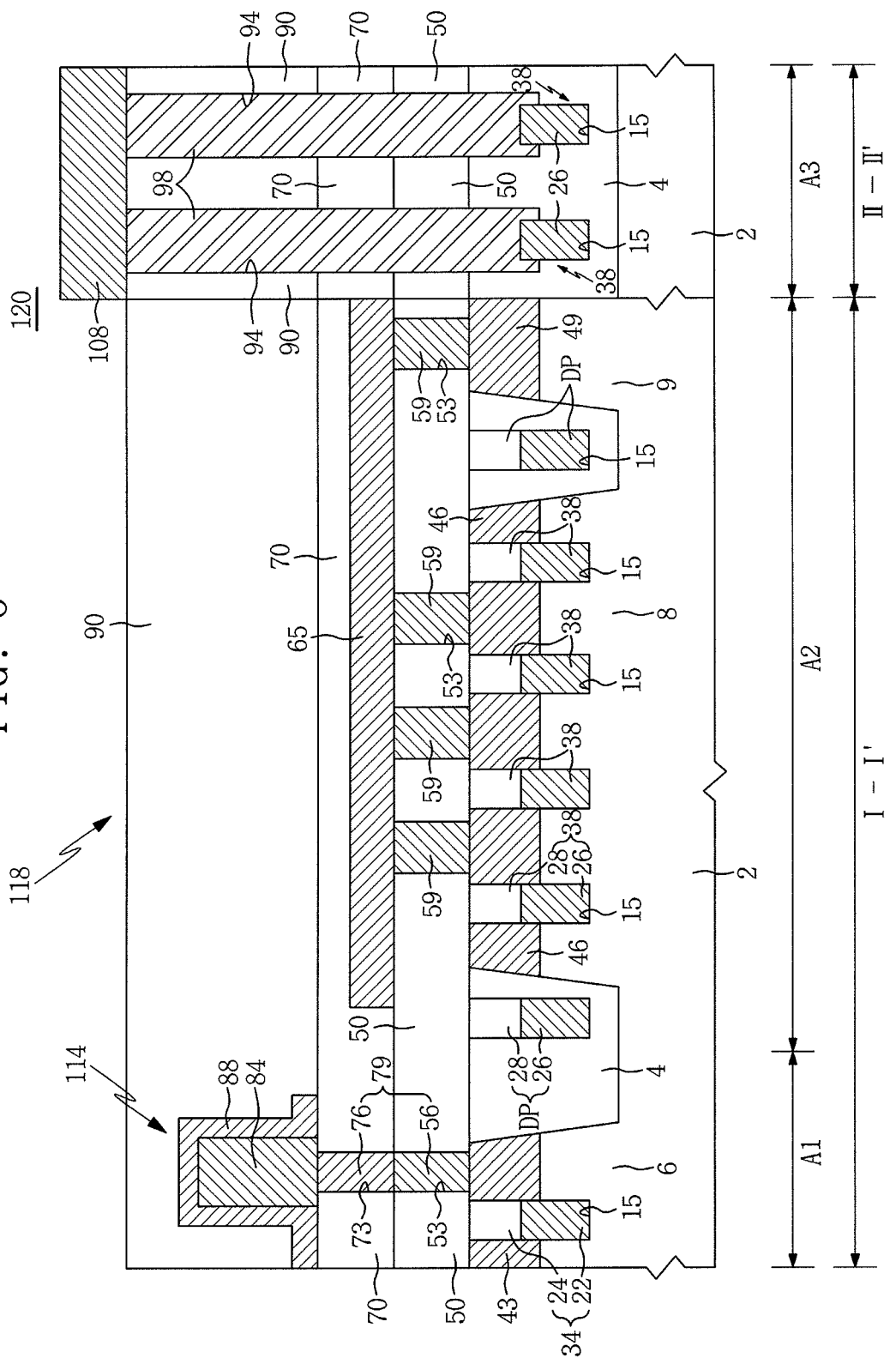

FIG. 6 is a cross-sectional view taken along lines I-I' and II-II' of FIG. 1, which illustrates a method of forming a semiconductor device according to an embodiment of the inventive concept, wherein the same reference numerals are used to denote the same or substantially the same elements as those described in connection with FIGS. 3 through 5.

Referring to FIG. 6, according to an embodiment, the semiconductor substrate 2 of FIG. 3 is prepared. The semiconductor substrate 2 has a cell array region C and a peripheral circuit region P. The processing steps described with reference to FIGS. 3 through 5 are performed on the cell array region C and the peripheral circuit region P. A region A1 of the cell array region C has the same structure as that of FIG. 5. A region A2 of the peripheral active region P has the same structure as that of FIG. 5. A region A3 of the peripheral active region P has a similar structure to that of FIG. 5.

According to an embodiment, through holes 94 in the region A3 of the peripheral active region P may pass through the inactive region 4, the peripheral mask patterns 28, and the first to third interlayer insulating layers 50, 70, and 90 to expose upper portions of the peripheral conductive patterns 38. Unlike FIG. 5, the through holes 94 have the same width on and under a top surface of the inactive region 4. Studs 98 are formed in the through holes 94. Lower portions of the studs 98 cover upper portions of peripheral connection patterns 26.

Accordingly, a stack-type capacitor 114 of the cell array region C and a trench-type capacitor 118 of the peripheral circuit region P constitute a semiconductor device 120 according to an embodiment of the inventive concept. According to an embodiment, an upper node 88 in the region A1 of the cell array region C and a substrate contact region 65 in the region A2 of the peripheral circuit region P are formed on the first or second interlayer insulating layer 50 or 70 through the same processing steps described with reference to FIG. 5.

According to an embodiment, the substrate connection pattern 65 of the region A2 and the node connection pattern 108 of the region A3 in the peripheral circuit region P may be formed at the same level through the same processing steps described with reference to FIG. 5. According to an embodiment, the substrate connection pattern 65, the upper node 88, and the node connection pattern 108 may be formed at the same level through the same processing steps described with reference to FIG. 5.

Figure 7:
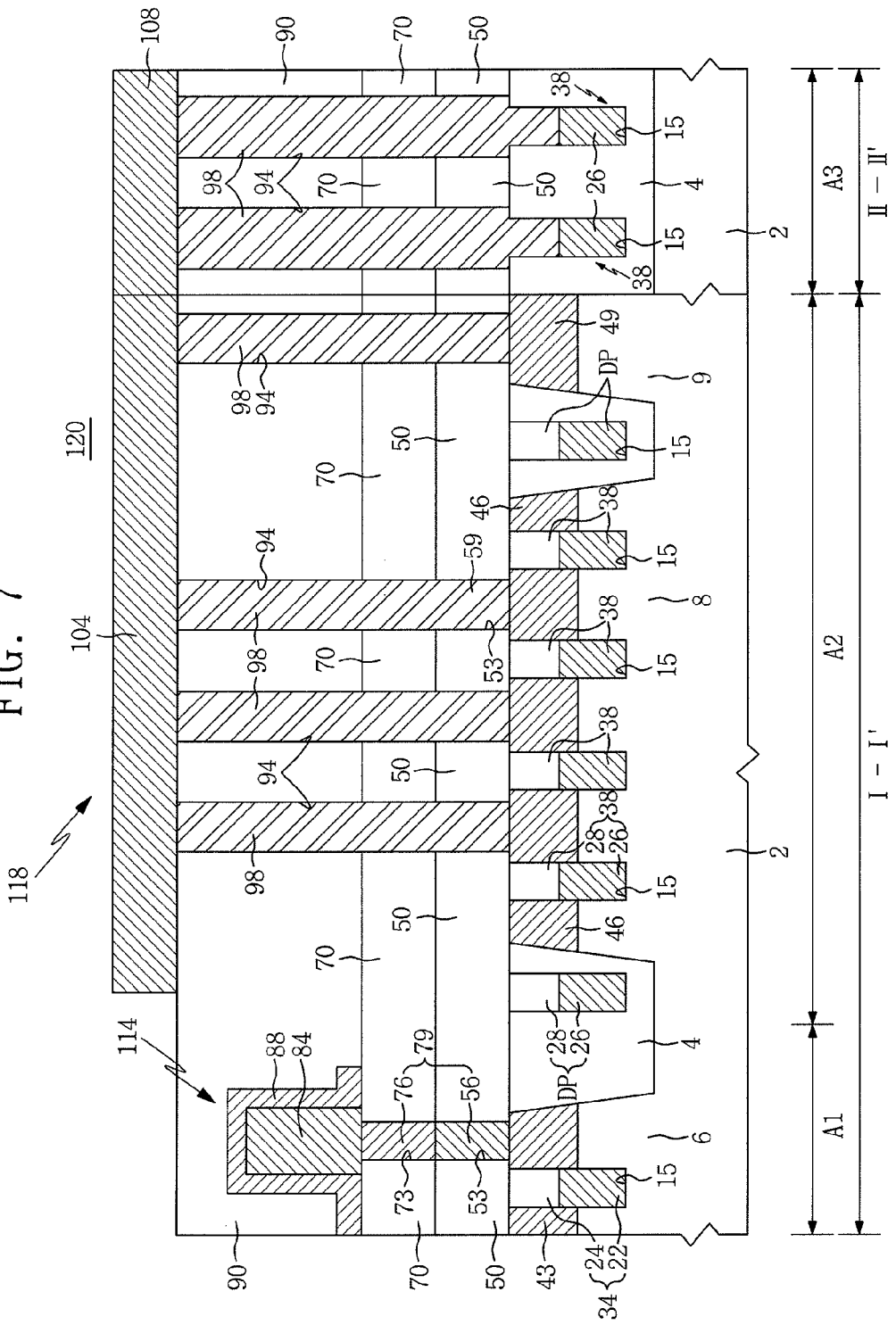

FIG. 7 is a cross-sectional view taken along lines I-I' and II-II' of FIG. 1, which illustrates a method of forming a semiconductor device according to embodiments of the inventive concept, wherein the same reference numerals are used to denote the same or substantially the same elements as those described in connection with FIGS. 3 through 5.

Referring to FIG. 7, according to an embodiment, the semiconductor substrate 2 of FIG. 3 is prepared. The semiconductor substrate 2 has a cell array region C and a peripheral circuit region P. The processing steps described with reference to FIGS. 3 through 5 are performed on the cell array region C and the peripheral circuit region P. A region A1 of the cell array region C has the same structure as the region A1 of FIG. 5. A region A3 of the peripheral circuit region P has the same structure as the region A3 of FIG. 5. A region A2 of the peripheral circuit region P may have a different structure from the region A2 of FIG. 5.

According to an embodiment, the region A2 of the peripheral circuit region P may not have the peripheral plugs 59 in the first interlayer insulating layer 50 and the substrate contact plugs 65 in the second interlayer insulating layer 70 as shown in FIG. 5. Subsequently, a stack-type capacitor 114 is formed on the second interlayer insulating layer 70 in the cell array region C. A third interlayer insulating layer 90 is formed on the second interlayer insulating layer 70 of the cell array region C and the peripheral circuit region P to cover the stack-type capacitor 114. Through holes 94 are formed in the first to third interlayer insulating layers 50, 70, and 90 in the region A2 of the peripheral circuit region P.

The through holes 94 in the region A2 of the peripheral circuit region P may be formed in the same step as or a different step from a step of forming holes 94 in the region A3 of the peripheral circuit region P. The through holes 94 in the region A2 of the peripheral circuit region P expose the first and second peripheral active regions 8 and 9. Studs 98 are formed in the through holes 94 in the region A2 of the peripheral circuit region P. The studs 98 in the region A2 of the peripheral circuit region P may be formed in the same step as or a different step from a step of forming studs 98 in the region A3 of the peripheral circuit region P. A substrate connection pattern 104 is formed on the third interlayer insulating layer 90 to cover the studs 98 in the region A2 of the peripheral circuit region P.

The substrate connection pattern 104 may be formed in the same step as or different step from a step of forming a node connection pattern 108 in the region A3 of the peripheral circuit region P. The node connection pattern 108 constitutes a trench-type capacitor 118, together with the semiconductor substrate 2, the first and second peripheral active regions 8 and 9, the node patterns 38, the first and second peripheral impurity diffusion regions 46 and 49, and the substrate connection pattern 104. The trench-type capacitor 118 and the stack-type capacitor 114 constitute a semiconductor device 120 according to an embodiment of the inventive concept.

According to an embodiment, the stack-type capacitor 114 in the region A1 of the cell array region C may be located in the first interlayer insulating layer 50 to be in direct contact with one of the cell impurity regions 43. The stack-type capacitor 114 is located on the first interlayer insulating layer 50 and in electrical contact with one of the cell impurity regions 43 through a first cell plug 56. According to an embodiment, the substrate connection pattern 104 may be formed on the second interlayer insulating layer 70, and the stack-type capacitor 114 may be formed on the third interlayer insulating layer 90.

According to an embodiment, the region A1 of the cell active region C may have a second cell plug 76 in the second and third interlayer insulating layers 70 and 90. The studs 98 in the region A2 of the peripheral active region P are formed in the first and second interlayer insulating layers 50 and 70.

Figure 8:
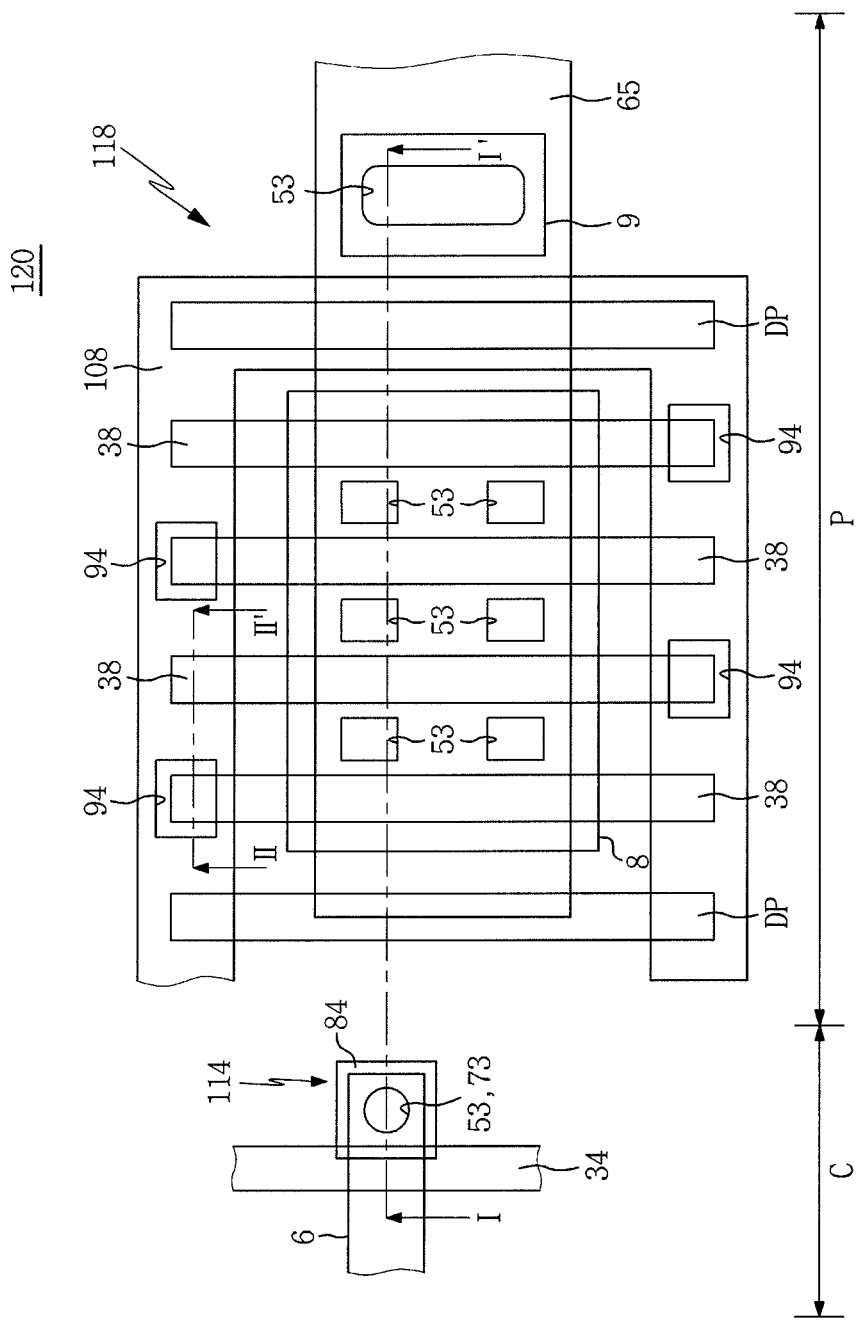
FIG. 8 is a plan view of a semiconductor device according to an embodiment of the inventive concept.
Figure 9:
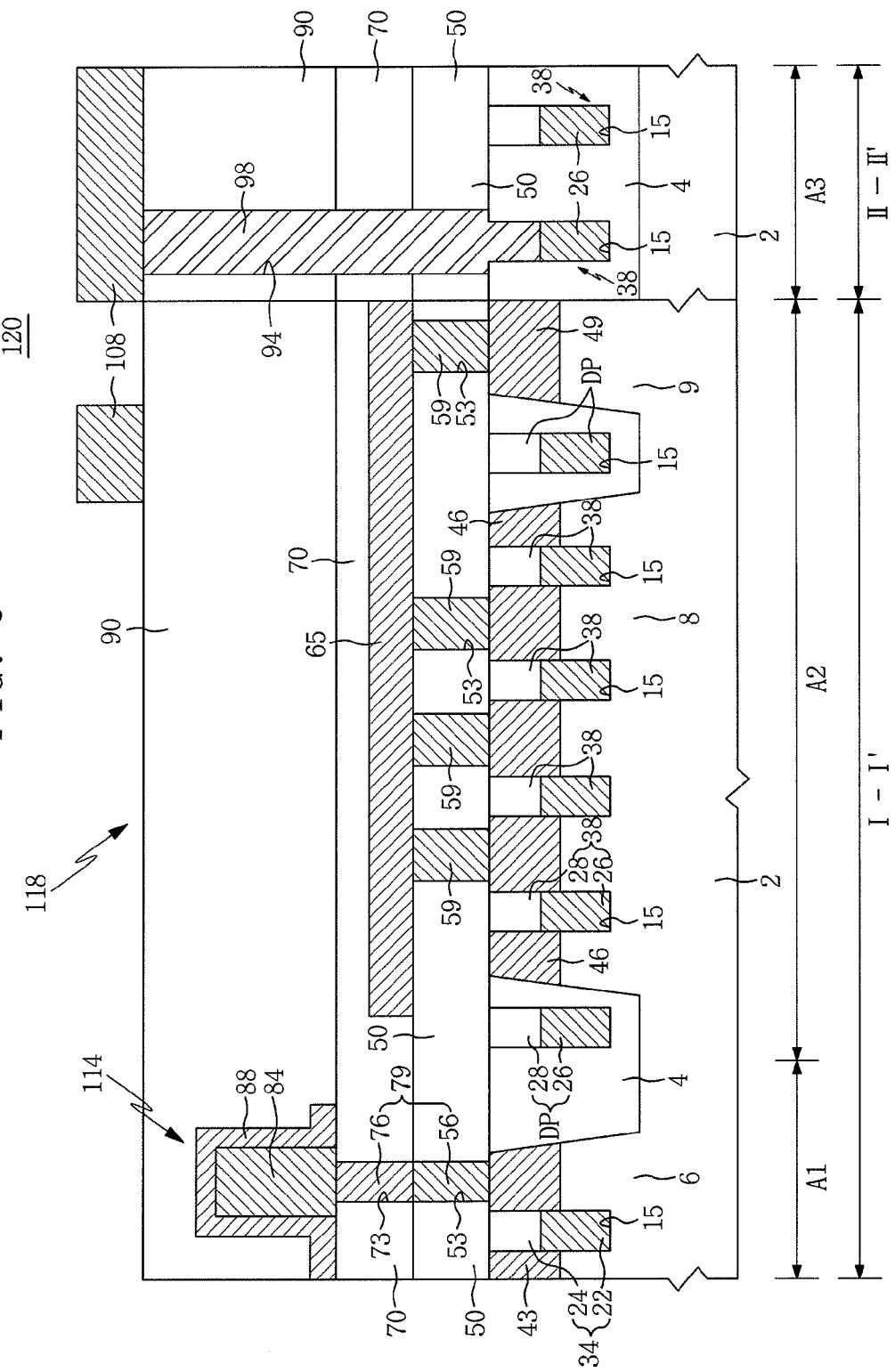
FIG. 9 is a cross-sectional view taken along lines I-I' and II-II' of FIG. 8, which illustrates a method of forming a semiconductor device according to an embodiment of the inventive concept.

FIG. 8 is a plan view of a semiconductor device according to an embodiment of the inventive concept, and FIG. 9 is a cross-sectional view taken along lines I-I' and II-II' of FIG. 8, which illustrates a method of forming a semiconductor device according to an embodiment of the inventive concept, wherein the same reference numerals are used to denote the same or substantially the same elements as those described in connection with FIGS. 1 through 5.

Referring to FIG. 8, a semiconductor device 120 according to an embodiment includes a cell array region C, which has at least one cell active region 6, at least one cell buried pattern 34, a connection hole 53, a landing hole 73, and at least one stack-type capacitor 114. The configuration of the cell active region 6, the cell buried pattern 34, the connection hole 53, the landing hole 73, and the stack-type capacitor 114 is the same as that shown in FIG. 1.

The semiconductor device 120 according to an embodiment further includes a trench-type capacitor 118 in the peripheral circuit region P. The trench-type capacitor 118 has first and second peripheral active regions 8 and 9, dummy patterns DP, node patterns 38, a substrate connection pattern 65, connection holes 53, through holes 94, and a node connection pattern 108. The configuration of the first and second peripheral active regions 8 and 9, the dummy patterns DP, and the node patterns 38 is the same as that shown in FIG. 1. The configuration of the connection holes 53, the substrate connection pattern 65 and the first and second peripheral active regions 8 and 9 is the same as that shown in FIG. 1.

The configuration of the through holes 94 and the node connection pattern 108 with respect to the node patterns 38 is different from that shown in FIG. 1. According to an embodiment, the through holes 94 may be disposed at two opposite sides of the first peripheral active region 8 in a direction perpendicular to the arrangement direction of the dummy patterns DP and the node patterns 38. More specifically, the through holes 94 are disposed at selected end portions of every other node pattern 38 in the node patterns 38.

Alternatively, the through holes 94 may be disposed at selected end portions of every third node pattern 38. The node connection pattern 108 is disposed in the vicinity of the first peripheral active region 8. More specifically, the node connection pattern 108 is disposed along a portion of the node pattern 38 to open one side portion of the node pattern 38. Alternatively, the node connection pattern 108 may surround the node patterns 38. Part of the node connection pattern 108 is in electrical contact with the node patterns 38 through the through holes 94.

Referring to FIG. 9, according to an embodiment, the semiconductor substrate 2 of FIG. 3 is prepared. The semiconductor substrate 2 has a cell array region C and a peripheral circuit region P. The processing steps described with reference to FIGS. 3 through 5 are performed on the cell array region C and the peripheral circuit region P. A region A1 of the cell array region C has the same structure as that of FIG. 5. A region A2 of the peripheral circuit region P has a similar structure to that of FIG. 5.

Specifically, the region A2 of the peripheral circuit region P has the same structure as the region A2 of FIG. 5 under a third interlayer insulating layer 90. The region A2 of the peripheral circuit region P has a node connection pattern 108 on the third interlayer insulating layer 90. A region A3 of the peripheral circuit region P has a similar structure to the region A3 of FIG. 5. More specifically, the region A3 of the peripheral circuit region P has first to third interlayer insulating layers 50, 70, and 90 on an inactive region 4. A through hole 94 is formed in the first to third interlayer insulating layers 50, 70, and 90.

The through hole 94 is aligned with one of the node patterns 38. The through hole 94 has the same structure as that of the through holes 94 of FIG. 2 or 5. The through hole 94 has the same structure as that of the through holes 94 of FIG. 6. A stud 98 is formed in the through hole 94. The stud 98 sufficiently fills the through hole 94. The node connection pattern 108 is formed on the third interlayer insulating layer 90 to cover the stud 98.

The node connection pattern 108 in the region A3 of the peripheral circuit region P is formed in the same step as a step of forming the node connection pattern 108 in the region A2 of the peripheral circuit region P. The node connection pattern 108 constitutes a trench-type capacitor 118, together with the semiconductor substrate 2, first and second peripheral active regions 8 and 9, node patterns 38, first and second peripheral impurity diffusion regions 46 and 49, and a substrate connection pattern 65. The trench-type capacitor 118 and a stack-type capacitor 114 constitute a semiconductor device 120 according to an embodiment.

According to an embodiment, an upper node 88 in the region A1 of the cell array region C and the substrate connection pattern 65 in the region A2 of the peripheral circuit region P may be formed on the first or second interlayer insulating layer 50 or 70 through the same processing steps as described with reference to FIG. 5. According to an embodiment, the upper node 88 may be disposed at a higher level than the node connection pattern 108, or the upper node 88 may be formed at the same level as the node connection pattern 108.

Figure 10:
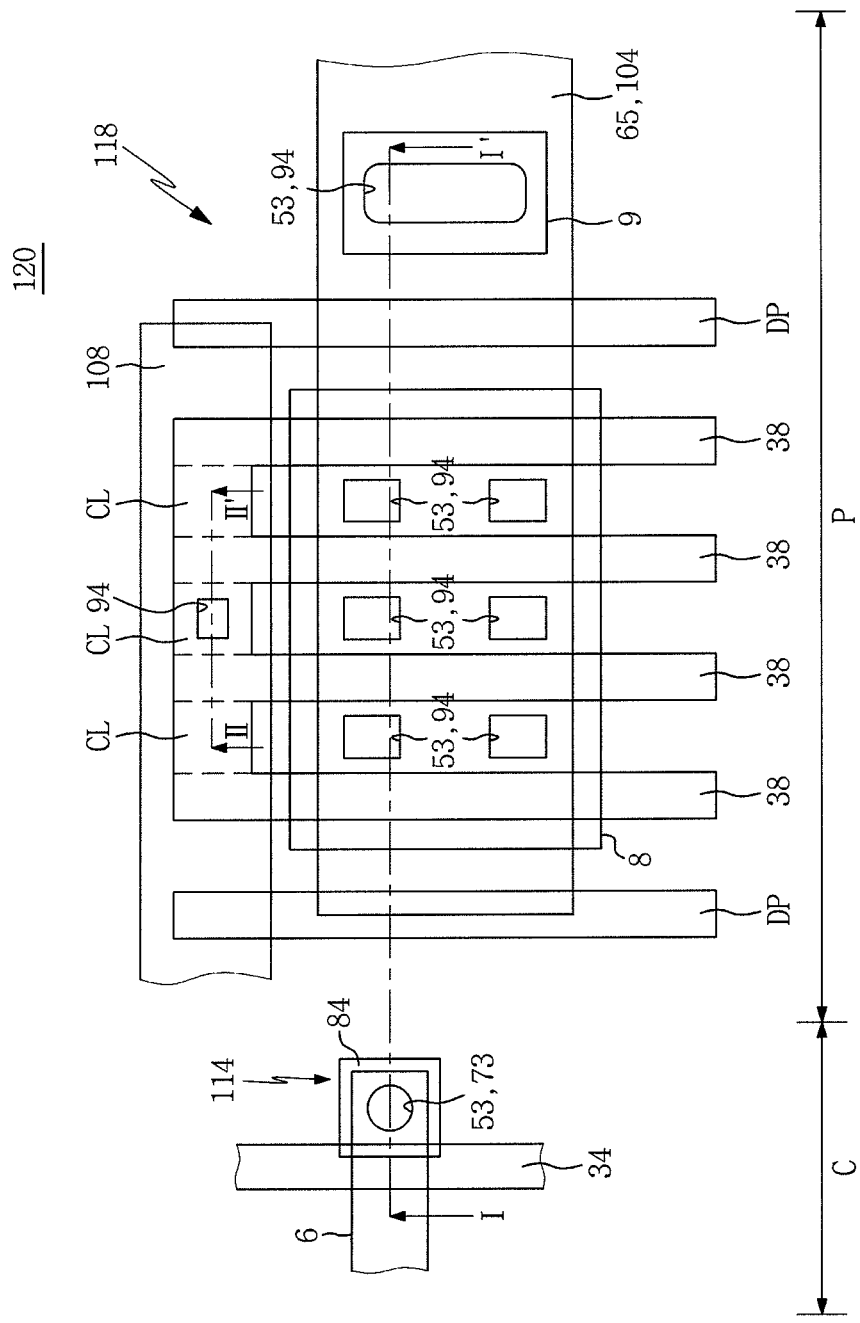
FIG. 10 is a plan view of a semiconductor device according to an embodiment of the inventive concept.
Figure 11:
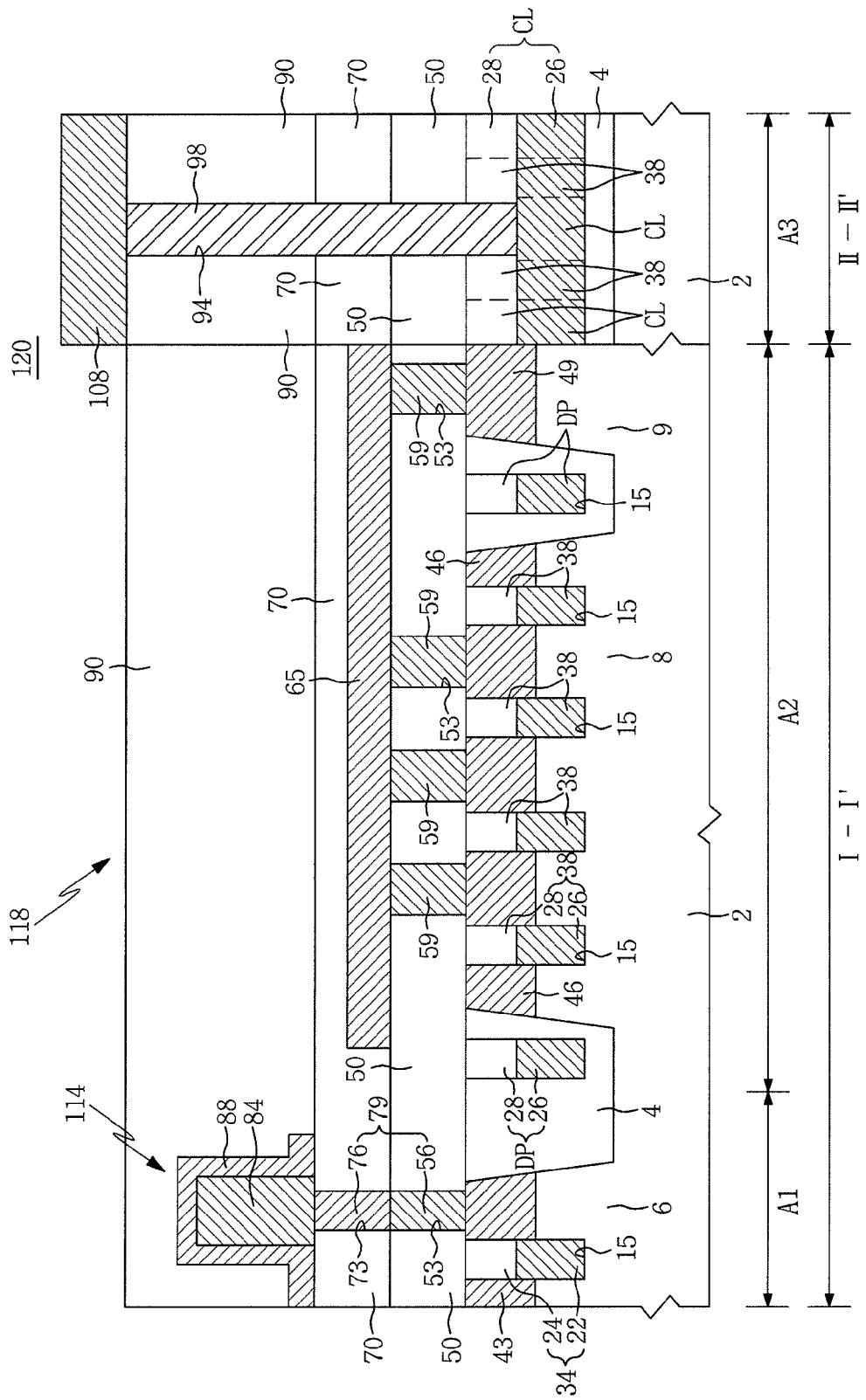
FIG. 11 is a cross-sectional view taken along lines I-I' and II-II' of FIG. 10, which illustrates a method of forming a semiconductor device according to an embodiment of the inventive concept.

FIG. 10 is a plan view of a semiconductor device according to an embodiment of the inventive concept, and FIG. 11 is a cross-sectional view taken along lines I-I' and II-II' of FIG. 10, which illustrates a method of forming a semiconductor device according to an embodiment of the inventive concept, wherein the same reference numerals are used to denote the same or substantially the same elements as those described in connection with FIGS. 1 through 5.

Referring to FIG. 10, a semiconductor device 120 according to an embodiment includes a cell array region C, which has at least one cell active region 6, at least one cell buried pattern 34, a connection hole 53, a landing hole 73, and at least one stack-type capacitor 114. The configuration of the cell active region 6, the cell buried pattern 34, the connection hole 53, the landing hole 73, and the stack-type capacitor 114 is the same as that shown in FIG. 1.

The semiconductor device 120 according to an embodiment further includes a trench-type capacitor 118 in the peripheral circuit region P. The trench-type capacitor 118 has first and second peripheral active regions 8 and 9, dummy patterns DP, node patterns 38, a substrate connection pattern 65 or 104, connection holes 53, through holes 94, and a node connection pattern 108. The configuration of the first and second peripheral active regions 8 and 9, the dummy patterns DP, and the node patterns 38 is the same as that shown in FIG. 1.

The trench-type capacitor 118 has connection lines CL between the node patterns 38. The connection lines CL connect end portions of the node patterns 38 at one side of the first peripheral active region 8 along the arrangement direction of the dummy patterns DP and the node patterns 38. The configuration of the connection holes 53, the substrate connection pattern 65, and the first and second peripheral active regions 8 and 9 is the same as that shown in FIGS. 1, 2, 5 and 6. The configuration of selected through holes 94, the substrate connection pattern 104, and the first and second peripheral active regions 8 and 9 is the same as that shown in FIGS. 1 and 7.

The node connection pattern 108 overlaps the node patterns 38 and the connection lines CL at the one side of the first peripheral active region 8. The node connection pattern 108 is in electrical contact with at least one of the node patterns 38 and the connection lines CL through the remaining through hole 94.

Referring to FIG. 11, according to an embodiment, the semiconductor substrate 2 of FIG. 3 is prepared. The semiconductor substrate 2 has a cell array region C and a peripheral circuit region P. The processing steps described with reference to FIGS. 3 through 5 are performed on the cell array region C and the peripheral circuit region P. A region A1 of the cell array region C has the same structure as that of FIG. 5. A region A2 of the peripheral circuit region P has the same structure as that of FIG. 5. A region A3 of the peripheral circuit region P may have a different structure from that of FIG. 5.

Specifically, the region A3 of the peripheral circuit region P has node patterns 38 and connection lines CL in an inactive region 4. The connection lines CL are disposed along the arrangement direction of dummy patterns DP and node patterns 38 to connect the node patterns 38 to each other. The connection lines CL are formed at the same level as the node patterns 38. The connection lines CL have the same structure as the node patterns 38. First to third interlayer insulating layers 50, 70, and 90 are formed on the connection lines CL and the node patterns 38.

Through holes 94 are formed in the first to third interlayer insulating layers 50, 70, and 90. The through holes 94 pass through a peripheral mask pattern 28 of at least one of the node patterns 38 and the connection lines CL, and the first to third interlayer insulating layers 50, 70, and 90 to expose a peripheral conductive pattern 26. The through hole 94 has the same width or different widths on and under a top surface of an inactive region 4. A stud 98 is formed in the through hole 94.

The stud 98 sufficiently fills the through hole 94. A node connection pattern 108 is formed on the third interlayer insulating layer 90 to cover the stud 98. The node connection pattern 108 constitutes a trench-type capacitor 118, together with the semiconductor substrate 2, first and second peripheral active regions 8 and 9, the node patterns 38, first and second peripheral impurity diffusion regions 46 and 49, and a substrate connection pattern 65. The trench-type capacitor 118 and a stack-type capacitor 114 constitute a semiconductor device 120 according to an embodiment.

According to an embodiment, an upper node 88 in the region A1 of the cell array region C and the substrate connection pattern 65 in the region A2 of the peripheral circuit region P are formed on the first or second interlayer insulating layer 50 or 70 through the same processing steps as described with reference to FIG. 5. According to an embodiment, the substrate connection pattern 65 may be formed at the same level as a node connection pattern 108 through the same processing steps described with reference to FIG. 5. According to an embodiment, the substrate connection pattern 65, the upper node 88, and the node connection pattern 108 may be formed at the same level through the same processing steps described with reference to FIG. 5.

Figure 12:
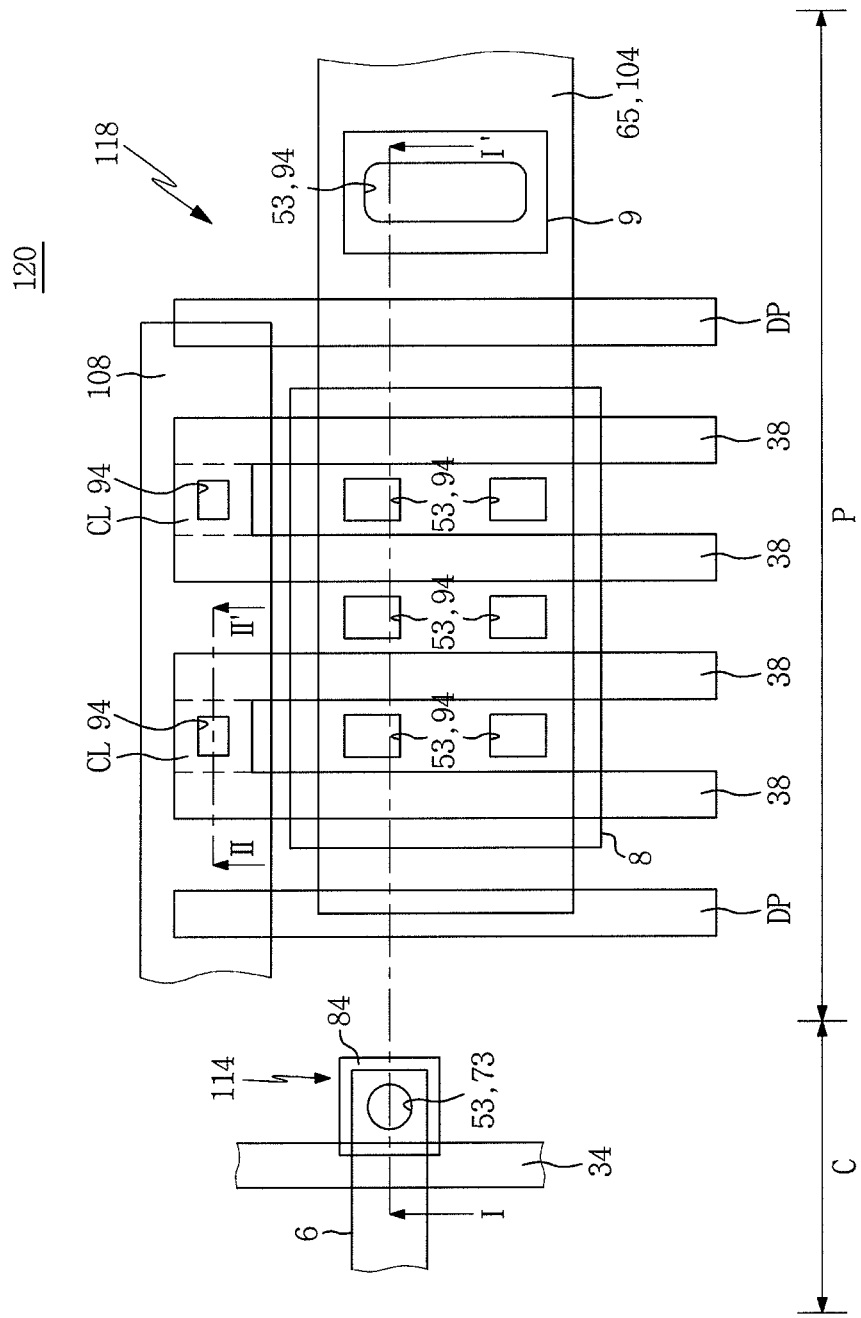
FIG. 12 is a plan view of a semiconductor device according to an embodiment of the inventive concept and FIG. 13 is a cross-sectional view taken along lines I-I' and II-II' of FIG. 12, which illustrates a method of forming a semiconductor device according to an embodiment of the inventive concept.
Figure 13:
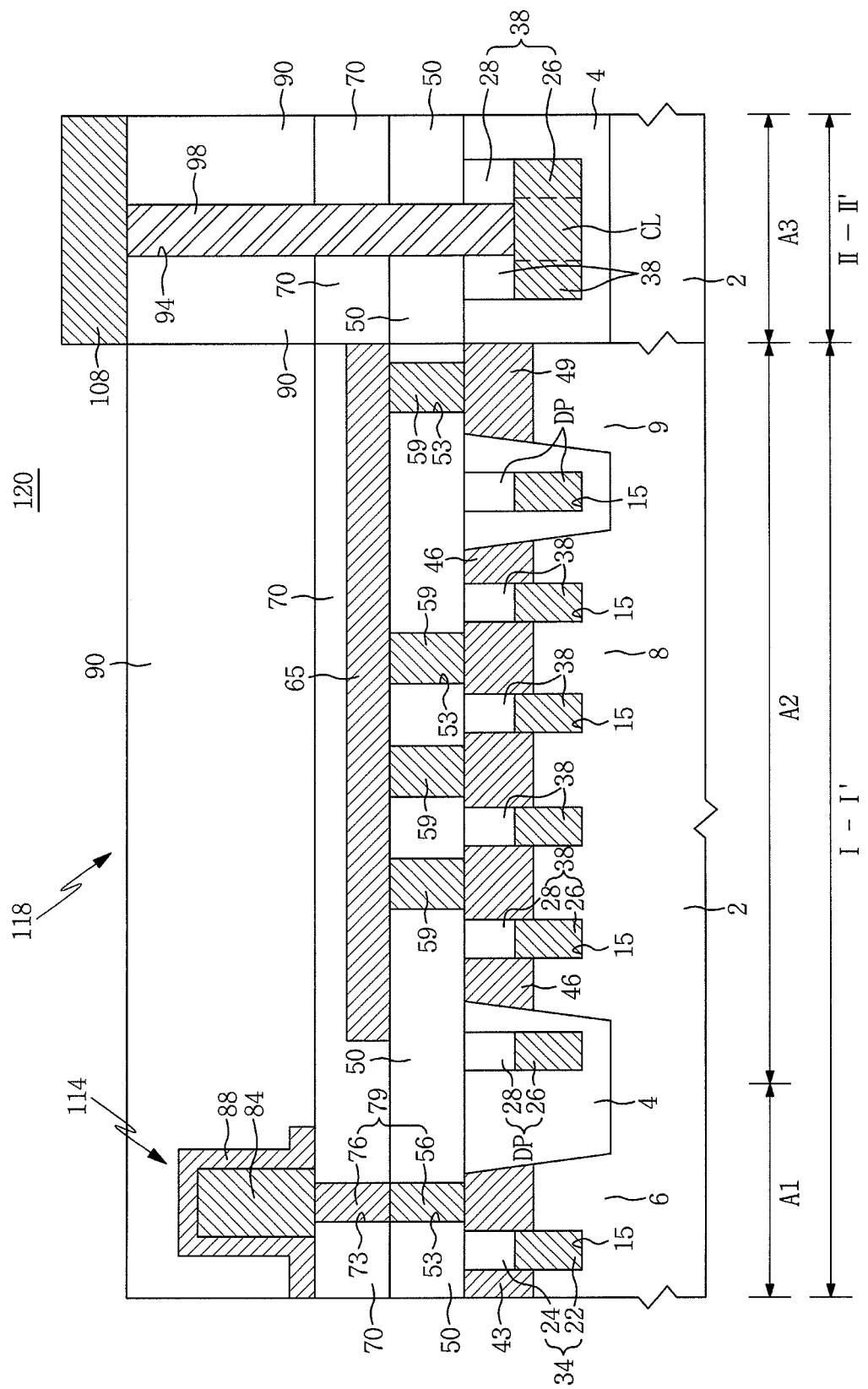

FIG. 12 is a plan view of a semiconductor device according to an embodiment of the inventive concept, and FIG. 13 is a cross-sectional view taken along lines I-I' and II-II' of FIG. 12, which illustrates a method of forming a semiconductor device according to an embodiment of the inventive concept, wherein the same reference numerals are used to denote the same or substantially the same elements as those described in connection with FIGS. 1 through 5.

Referring to FIG. 12, a semiconductor device 120 according to an embodiment includes a cell array region C, which has at least one cell active region 6, at least one cell buried pattern 34, a connection hole 53, a landing hole 73, and at least one stack-type capacitor 114. The configuration of the cell active region 6, the cell buried pattern 34, the connection hole 53, the landing hole 73, and the stack-type capacitor 114 is the same as that shown in FIG. 1.

The semiconductor device 120 according to an embodiment further includes a trench-type capacitor 118 in the peripheral circuit region P. The trench-type capacitor 118 has first and second peripheral active regions 8 and 9, dummy patterns DP, node patterns 38, a substrate connection pattern 65 or 104, connection holes 53, through holes 94, and a node connection pattern 108. The configuration of the first and second peripheral active regions 8 and 9, the dummy patterns DP, and the node patterns 38 is the same as that shown in FIG. 1.

The trench-type capacitor 118 has connection lines CL between the node patterns 38. The connection lines CL connect end portions of the node patterns 38 at one side of the first peripheral active region 8 along the arrangement direction of the dummy patterns DP and the node patterns 38. Specifically, the connection lines CL connect selected end portions of the node patterns 38 to each other, wherein the selected end portions define odd- or even-numbered spaces between the node patterns 38. The configuration of connection holes 53, the substrate connection pattern 65, and the first and second peripheral active regions 8 and 9 is the same as that shown in FIGS. 1, 2, 5 and 6.

The configuration of selected through holes 94, and the substrate connection pattern 104, and the first and second peripheral active regions 8 and 9 is the same as that shown in FIGS. 1 and 7. The node connection pattern 108 overlaps the node patterns 38 and the connection lines CL at the one side of the first peripheral active region 8. The node connection pattern 108 is in electrical contact with at least one of the node patterns 38 and the connection lines CL through the remaining through holes 94.

Referring to FIG. 13, according to an embodiment, a semiconductor substrate 2 of FIG. 3 is prepared. The semiconductor substrate 2 has a cell array region C and a peripheral circuit region P. The processing steps described with reference to FIGS. 3 through 5 are performed on the cell array region C and the peripheral circuit region P. A region A1 of the cell array region C has the same structure as that of FIG. 5. A region A2 of the peripheral circuit region P has the same structure as that of FIG. 5. A region A3 of the peripheral circuit region P has a different structure from that of FIG. 5.

Specifically, the region A3 of the peripheral circuit region P has node patterns 38 and a connection line CL in an inactive region 4. The connection line CL is interposed between two node patterns 38 to connect the two node patterns 38 to each other. The connection line CL is formed at the same level as the node patterns 38. The connection line CL has the same structure as the node pattern 38. First to third interlayer insulating layers 50, 70, and 90 are formed on the connection line CL and the node patterns 38.

Through holes 94 are formed in the first to third interlayer insulating layers 50, 70, and 90. The through hole 94 passes through a peripheral mask pattern 28 of at least one of the node patterns 38 and the connection lines CL, and the first to third interlayer insulating layers 50, 70, and 90 to expose a peripheral conductive pattern 26. The through hole 94 has the same width or different widths on and under a top surface of the inactive region 4. A stud 98 is formed in the through hole 94.

The stud 98 sufficiently fills the through hole 94. A node connection pattern 108 is formed on the third interlayer insulating layer 90 to cover the stud 98. A trench-type capacitor 118 includes the node connection pattern 108, the semiconductor substrate 2, first and second peripheral active regions 8 and 9, the node patterns 38, first and second peripheral impurity diffusion regions 46 and 49, and a substrate connection pattern 65. The trench-type capacitor 118 and a stack-type capacitor 114 constitute a semiconductor device 120 according to an embodiment.

According to an embodiment, an upper node 88 in the region A1 of the cell array region C and the substrate connection pattern 65 in the region A2 of the peripheral circuit region P are formed on the first or second interlayer insulating layer 50 or 70 through the same processing steps as described with reference to FIG. 5. According to an embodiment, the substrate connection pattern 65 may be formed at the same level as the node connection pattern 108 through the same processing steps described with reference to FIG. 5. According to an embodiment, the substrate connection pattern 65, the upper node 88, and the node connection pattern 108 may be formed at the same level through the same processing steps described with reference to FIG. 5.

Figure 14:
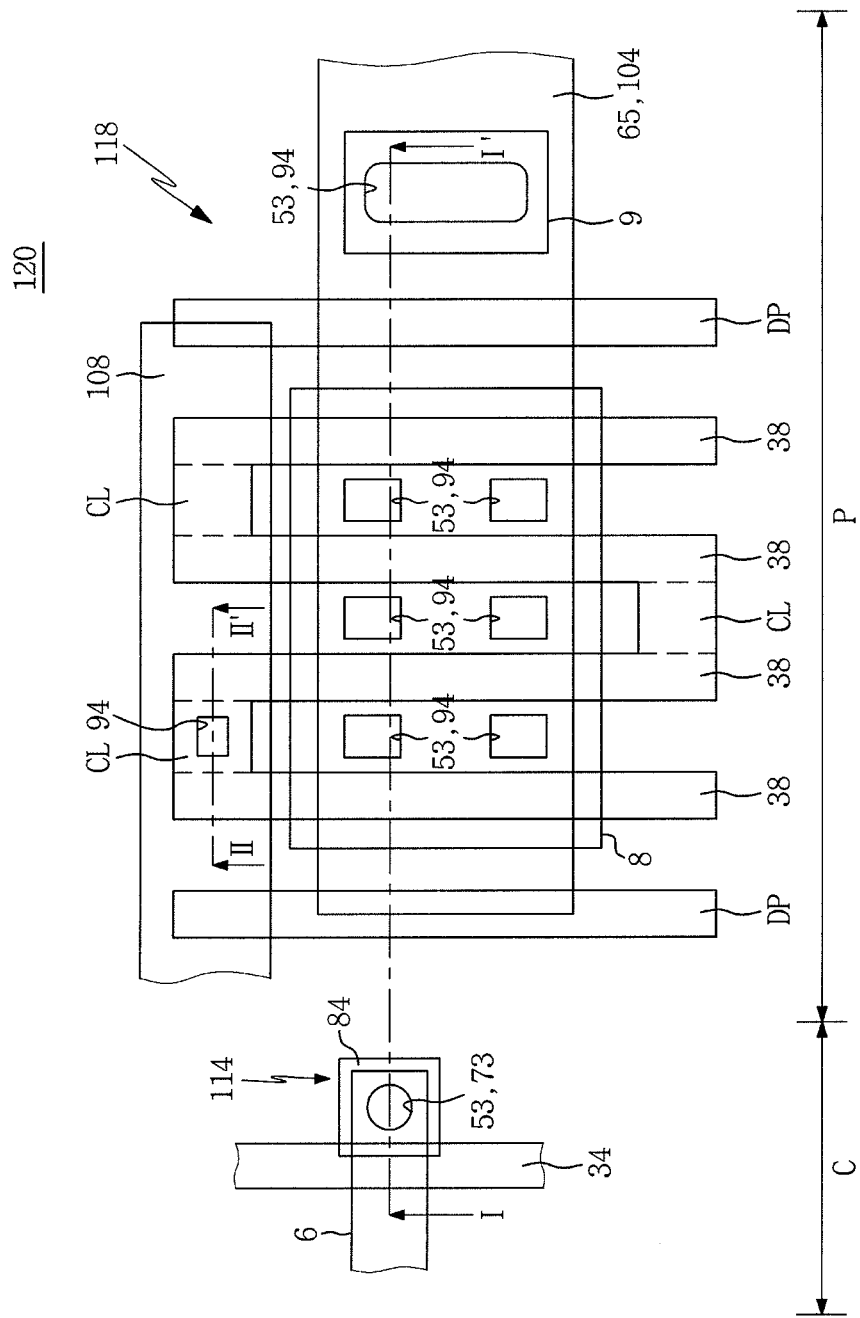
FIG. 14 is a plan view which illustrates a method of forming a semiconductor device according to an embodiment of the inventive concept.

FIG. 14 is a plan view which illustrates a method of forming a semiconductor device according to an embodiment of the inventive concept, wherein the same reference numerals are used to denote the same or substantially the same elements as those described in connection with FIG. 1.

Referring to FIG. 14, a semiconductor device 120 according to an embodiment includes a cell array region C, which has at least one cell active region 6, at least one cell buried pattern 34, a connection hole 53, a landing hole 73, and at least one stack-type capacitor 114. The configuration of the cell active region 6, the cell buried pattern 34, the connection hole 53, the landing hole 73, and the stack-type capacitor 114 is the same as that shown in FIG. 1.

The semiconductor device 120 according to an embodiment further includes a trench-type capacitor 118 in the peripheral circuit region P. The trench-type capacitor 118 has first and second peripheral active regions 8 and 9, dummy patterns DP, node patterns 38, a substrate connection pattern 65 or 104, connection holes 53, through holes 94, and a node connection pattern 108. The configuration of the first and second peripheral active regions 8 and 9, the dummy patterns DP, and the node patterns 38 is the same as that shown in FIG. 1.

The trench-type capacitor 118 has connection lines CL between the node patterns 38. The connection lines CL connect end portions of the node patterns 38 at both sides of the first peripheral active region 8 along the arrangement direction of the dummy patterns DP and the node patterns 38. Specifically, selected connection lines CL connect selected end portions of the node patterns 38 to each other, wherein the selected end portions define odd- or even-numbered spaces between the node patterns 38 in the vicinity of one side of the first peripheral active region 8.

The remaining connection lines CL connect the remaining end portions of the node patterns 38 to each other, wherein the remaining end portions define even- or odd-numbered spaces between the node patterns 38 in the vicinity of the other side of the first peripheral active region 8. The node patterns 38 and the connection lines CL are configured in one body. The configuration of the connection holes 53, the substrate connection pattern 65, and the first and second peripheral active regions 8 and 9 is the same as that of FIGS. 1, 2, 5, and 6.

The configuration of selected through holes 94, the substrate connection pattern 104, and the first and second peripheral active regions 8 and 9 is the same as that shown in FIGS. 1 and 7. The node connection pattern 108 overlaps the node patterns 38 and the connection lines CL in the vicinity of the one side of the first peripheral active region 8. The node connection pattern 108 is in electrical contact with at least one of the node patterns 38 and the connection lines CL through the remaining through holes 94.

Figure 15:
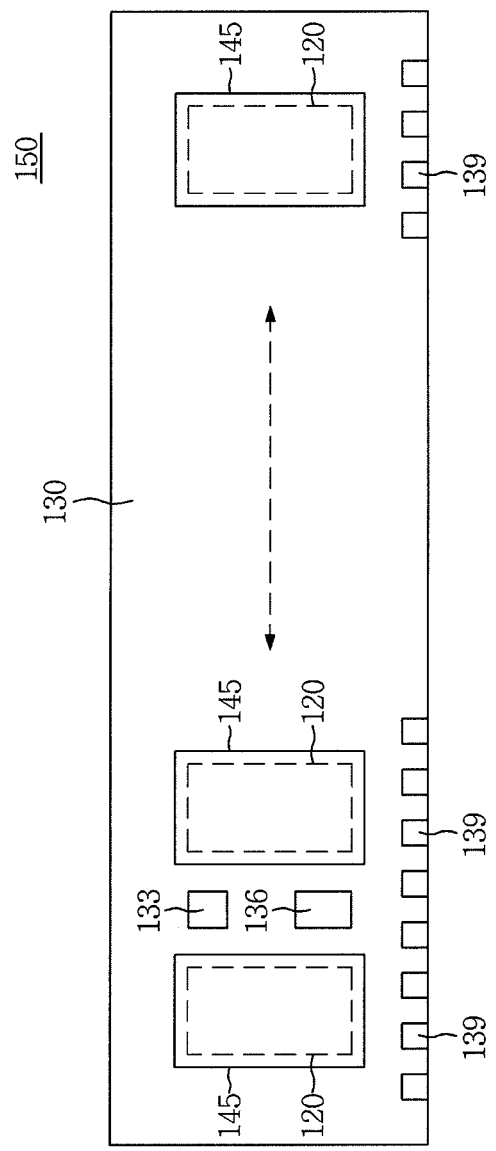
FIG. 15 is a plan view of a semiconductor module having the semiconductor device of FIG. 1.

FIG. 15 is a plan view of a semiconductor module having the semiconductor device of FIG. 1.

Referring to FIG. 15, a semiconductor module 150 according to an embodiment includes a module substrate 130. The module substrate 130 may be a printed circuit board, or a plate including an electric circuit. The module substrate 130 may include internal circuits (not shown), electric pads (not shown), and connectors 139. The internal circuits are in electrical contact with the electric pads and the connectors 139. Semiconductor package structures 145 and at least one resistor 133 are disposed on the module substrate 130.

The semiconductor package structures 145, the resistor 133, and at least one condenser 136 are disposed on the module substrate 130. The semiconductor package structures 145, the resistor 133 and/or the condenser 136 are in electrical contact with the electric pads. Each semiconductor package structure 145 includes at least one semiconductor device 120. The semiconductor device 120 has the same structure as that of FIG. 2, 5, 6, 7, 9, 11, 13, or 14.

Specifically, the semiconductor device 120 includes at least one stack-type capacitor 114 in a cell array region C and a trench-type capacitor 118 in a peripheral circuit region P. The stack-type capacitor 114 is disposed at an upper portion of a semiconductor substrate 2. At least one cell buried pattern 34 is disposed in the vicinity of the stack-type capacitor 114. The cell buried pattern 34 extends downwardly from a top surface of the semiconductor substrate 2 to a lower portion thereof. The trench-type capacitor 118 has node patterns 38 in the semiconductor substrate 2.

The node patterns 38 are located at the same level as the cell buried pattern 34 in the semiconductor substrate 2 and have the same structure as the cell buried pattern 34. Accordingly, the trench-type capacitor 118 has a larger area on the semiconductor substrate than the conventional art due to the node patterns 38. The semiconductor module 150 has more improved electrical characteristics than the conventional art due to the trench-type capacitor 118 of the semiconductor device 120. The semiconductor module 150 is in electrical contact with a processor-based system 190 of FIG. 16 through the connectors 139 of the module substrate 130.

Figure 16:
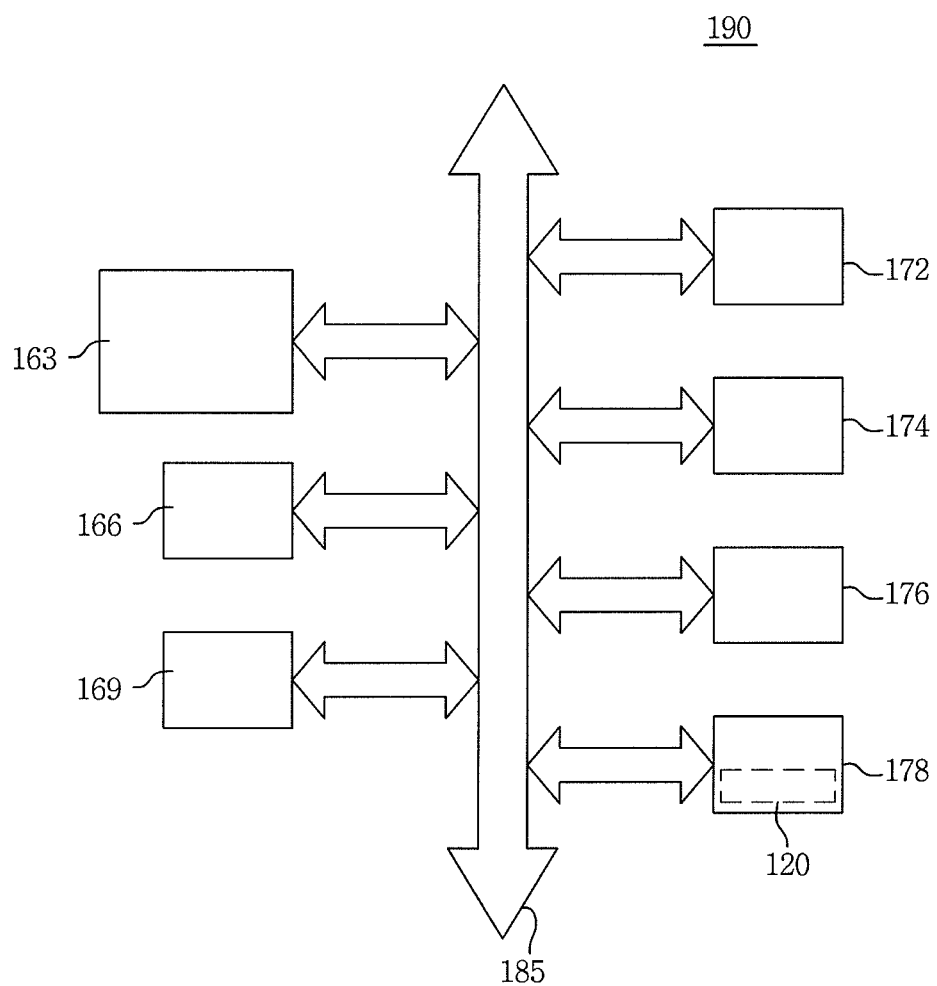
FIG. 16 is a plan view of a processor-based system having the semiconductor device of FIG. 1.

FIG. 16 is a plan view of a processor-based system having the semiconductor device of FIG. 1.

Referring to FIG. 16, a processor-based system 190 according to an embodiment includes at least one system board (not shown). The system board has at least one bus line 185. A first module unit is disposed on the bus line 185. The first module unit is in electrical contact with the bus line 185.

The first module unit includes a central processing unit (CPU) 163, a floppy disk drive 166, and a compact disk ROM drive 169. A second module unit is disposed on the bus line 185. The second module unit is in electrical contact with the bus line 185.

The second module device includes a first input/output device 172, a second input/output device 174, a read-only memory (ROM) 176, and a random access memory (RAM) 178. The RAM 178 includes the semiconductor module 150 of FIG. 15, or the semiconductor device 120 of FIG. 15. Accordingly, the processor-based system 190 has more improved electrical characteristics than that of the conventional art.

The processor-based system 190 may include a computer system, a process control system, or a different system from these systems.

As described above, according to the embodiments of the inventive concept, at least one cell buried pattern can be provided on a semiconductor substrate in a cell array region and node patterns are provided on a semiconductor substrate in a peripheral circuit region. The node patterns can be located at the same level as the cell buried pattern and have the same structure as the cell buried pattern. The node patterns and the semiconductor substrate can be included in a trench-type capacitor in the peripheral circuit region. Accordingly, the trench-type capacitor can have a larger capacitance than the conventional art.

According to the embodiments of the inventive concept, there can be provided a semiconductor device including at least one stack-type capacitor on a semiconductor substrate of the cell array region and a trench-type capacitor in the semiconductor substrate of the peripheral circuit region. The trench-type capacitor corresponds to a decoupling capacitor in an integrated circuit of the semiconductor device. The semiconductor device may have more improved electrical characteristics than the conventional art due to the trench-type capacitor. The semiconductor device is disposed in a semiconductor module. The semiconductor module may have more improved electrical characteristics than the conventional art due to the trench-type capacitor.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A trench-type capacitor, comprising:
   an inactive region located in a semiconductor substrate and defining first and second active regions;
   at least one node pattern having a conductive pattern and a mask pattern which are sequentially stacked from a lower portion of the semiconductor substrate to a top surface of the semiconductor substrate, the at least one node pattern extending from the first active region to the inactive region;
   a substrate connection pattern located on the semiconductor substrate and being in electrical contact with the first and second active regions;
   a node connection pattern spaced apart from the substrate connection pattern on the inactive region and being in electrical contact with the at least one node pattern; and
   a dielectric layer between the at least one node pattern and the semiconductor substrate.

2. The capacitor of claim 1, further comprising:
   at least one first impurity diffusion region located in a vicinity of the at least one node pattern and configured to extend downwardly from a top surface of the first active region lower than a bottom surface of the mask pattern; and
   a second impurity diffusion region disposed in the second active region,
   wherein the at least one first impurity diffusion region has a different conductivity type from a conductivity type of the second impurity diffusion region, the second impurity diffusion region has the same conductivity type as a conductivity type of the semiconductor substrate, and the substrate connection pattern extends from the first active region to the second active region and is in electrical contact with the at least one first impurity diffusion region and the second impurity diffusion region through plugs.

3. The capacitor of claim 2, further comprising: wherein the node connection pattern is in electrical contact with the at least one node pattern through a stud, and the stud extends toward the top surface from an upper portion of the semiconductor substrate and is in contact with the conductive pattern through the mask pattern of the at least one node pattern.

4. The capacitor of claim 3, further comprising:
at least one dummy pattern spaced apart from the first active region and disposed in the inactive region,
wherein the at least one dummy pattern is located at the same level as the at least one node pattern, has the same stacked structure as the at least one node pattern, and is disposed adjacent to the at least one node pattern to be parallel to the at least one node pattern, and wherein
the substrate connection pattern is disposed at the same level as the node connection pattern.

5. The capacitor of claim 3, further comprising:
at least one dummy pattern spaced apart from the first active region and disposed in the inactive region,
wherein the at least one dummy pattern is located at the same level as the at least one node pattern, has the same stacked structure as the at least one node pattern, and is disposed adjacent to the at least one node pattern to be parallel to the at least one node pattern, and wherein
the substrate connection pattern is disposed at a different level from the node connection pattern.

6. A semiconductor device, comprising:
a semiconductor substrate having a cell array region and a peripheral circuit region;
an inactive region defining at least one cell active region in the cell array region, and first and second peripheral active regions in the peripheral circuit region;
at least one cell buried pattern located in the cell array region, having a cell conductive pattern and a cell mask pattern which are sequentially stacked from a lower portion of the semiconductor substrate to a top surface of the semiconductor substrate, and configured to extend from the at least one cell active region to the inactive region; and
at least one trench-type capacitor located in the peripheral circuit region,
wherein the trench-type capacitor comprises:
node patterns located at the same level as the at least one cell buried pattern, the node patterns having peripheral conductive patterns and peripheral mask patterns which are sequentially stacked from a lower portion of the semiconductor substrate to the top surface of the semiconductor substrate, and the node patterns extending from the first peripheral active region to the inactive region;
a substrate connection pattern located on the semiconductor substrate and being in electrical contact with the first and second peripheral active regions; and
a node connection pattern spaced apart from the substrate connection pattern, located on the inactive region, and being in electrical contact with the node patterns, wherein first dielectric layers are disposed between node patterns and the first peripheral active region.

7. The device of claim 6, further comprising:
first impurity diffusion regions located adjacent to the at least one cell buried pattern and the node patterns, and configured to extend downwardly from top surfaces of the at least one cell active region and the first peripheral active region lower than bottom surfaces of the cell mask pattern and the peripheral mask patterns; and
a second impurity diffusion region disposed in the second peripheral active region.

8. The device of claim 7, wherein the first impurity diffusion regions have a different conductivity type from a conductivity type of the second impurity diffusion region, the second impurity diffusion region has the same conductivity type as a conductivity type of the semiconductor substrate, and the substrate connection pattern extends from the first peripheral active region to the second peripheral active region and is in electrical contact with the first and second impurity diffusion regions of the first and second peripheral active regions through first plugs.

9. The device of claim 8, further comprising:
at least one stack-type capacitor located at an upper portion of the semiconductor substrate and being in electrical contact with the at least one cell active region in a vicinity of the at least one cell buried pattern.

10. The device of claim 9, wherein the at least one stack-type capacitor is in electrical contact with a first impurity region of the at least one cell active region through a second plug, and has a lower node, a second dielectric layer, and an upper node which are sequentially stacked.

11. The device of claim 10, further comprising:
dummy patterns spaced apart from the first peripheral active region and disposed in the inactive region,
wherein the dummy patterns are located at the same level as the node patterns, have the same stacked structure as the node patterns, and are located near both sides of the node patterns along an arrangement direction of the node patterns, and wherein
the node patterns have end portions at both sides of the first peripheral active region in a direction perpendicular to the arrangement direction.

12. The device of claim 11, wherein the node connection pattern is in electrical contact with the end portions of the node patterns through studs at least one side of the first peripheral active region, wherein the studs extend to the top surface from an upper portion of the semiconductor substrate and are in contact with the peripheral conductive patterns through peripheral mask patterns of the node patterns.

13. The device of claim 11, wherein the node connection pattern is in electrical contact with selected end portions every at least second node pattern through studs in the vicinity of the both sides of the first peripheral active region, and wherein
the studs extend to the top surface from an upper portion of the semiconductor substrate and are in contact with the peripheral conductive patterns through peripheral mask patterns of the selected end portions.

14. The device of claim 11, further comprising:
connection lines located between the node patterns in the inactive region,
wherein the connection lines are located at the same level as the node patterns, and have the same stacked structure as the node patterns, and connect end portions of the node patterns at one side of the first peripheral active region or end portions of the node patterns defining odd- or even-numbered spaces between the node patterns along the alignment direction of the node patterns, wherein the node connection pattern is in electrical contact with the at least one of the connection lines and the node patterns through at least one stud, and wherein
the at least one stud extends to the top surface from an upper portion of the semiconductor substrate, and is in contact with a peripheral conductive pattern through at least one peripheral mask pattern of the node patterns and the connection lines.

15. The device of claim 11, further comprising:

first and second connection lines located between the node patterns, wherein the first and second connection lines are located at the same level as the node patterns, and have the same stacked structure as the node patterns, wherein the first connection lines connect selected end portions of the node patterns defining odd- or even-numbered spaces between the node patterns at one side of the first peripheral active region along the arrangement direction of the node patterns, and the second connection lines connect the remaining end portions of the node patterns defining even- or odd-numbered spaces between the node patterns in a vicinity of the other side of the first peripheral active region along the arrangement direction of the node patterns, wherein the node connection pattern is in electrical contact with at least one of the node patterns, and the first and second connection lines through at least one stud, and wherein the at least one stud extends to the top surface from an upper portion of the semiconductor substrate and is in contact with a peripheral conductive pattern through at least one peripheral mask pattern of the node patterns, and the first and second connection lines.

16. A semiconductor module, comprising:

a module substrate having at least electrical pads and an internal circuit, which are in electrical contact with each other; and at least one semiconductor package structure located on the module substrate and having at least one semiconductor device in electrical contact with the electrical pads, wherein the at least one semiconductor device has at least one trench-type capacitor in a semiconductor substrate, wherein the trench-type capacitor comprises:

an inactive region located in the semiconductor substrate and defining first and second active regions;

at least one node pattern having a conductive pattern and a mask pattern which are sequentially stacked from a lower portion of the semiconductor substrate to a top surface of the semiconductor substrate, and the at least one node pattern extending from the first active region to the inactive region;

a substrate connection pattern located on the semiconductor substrate and being in electrical contact with the first and second active regions; and a node connection pattern spaced apart from the substrate connection pattern, located on the inactive region, and being in electrical contact with the at least one node pattern, wherein a dielectric layer is formed between the at least one node pattern and the semiconductor substrate.

17. The module of claim 16, further comprising:

at least one first impurity diffusion region located in a vicinity of the at least one node pattern and extending downwardly from a top surface of the first active region lower than a bottom surface of the mask pattern; and a second impurity diffusion region disposed in the second active region, wherein the at least one first impurity diffusion region has a different conductivity type from a conductivity type of the second impurity diffusion region, and the second impurity diffusion region has the same conductivity type as a conductivity type of the semiconductor substrate, and wherein the substrate connection pattern extends from the first active region to the second active region and is in electrical contact with the at least one first impurity diffusion region and the second impurity diffusion region through plugs.

18. The module of claim 17, wherein the node connection pattern is in electrical contact with the at least one node pattern through a stud, wherein the stud extends to the top surface from an upper portion of the semiconductor substrate and is in contact with the conductive pattern through the mask pattern of the at least one node pattern.

19. The module of claim 18, further comprising:

at least one dummy pattern spaced apart from the first active region and disposed in the inactive region, wherein the at least one dummy pattern is located at the same level as the at least one node pattern, has the same stacked structure as the at least one node pattern, and is disposed in a vicinity of the at least one node pattern to be parallel to the at least one node pattern, and wherein the substrate connection pattern is disposed at the same level as the node connection pattern.

20. The module of claim 18, further comprising:

at least one dummy pattern spaced apart from the first active region and disposed in the inactive region, wherein the at least one dummy pattern is located at the same level as the at least one node pattern, has the same stacked structure as the at least one node pattern, and is disposed in a vicinity of the at least one node pattern to be parallel to the at least one node pattern, and wherein the substrate connection pattern is disposed at a different level from the node connection pattern.

* * * * *